US009246521B2

(12) United States Patent
Kanno

(10) Patent No.: US 9,246,521 B2
(45) Date of Patent: Jan. 26, 2016

(54) TRANSMISSION DEVICE, TRANSMISSION/RECEPTION DEVICE, INTEGRATED CIRCUIT, AND COMMUNICATION STATE MONITORING METHOD

(75) Inventor: Masayoshi Kanno, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 38 days.

(21) Appl. No.: 14/241,348

(22) PCT Filed: Aug. 28, 2012

(86) PCT No.: PCT/JP2012/071694
§ 371 (c)(1),
(2), (4) Date: Feb. 26, 2014

(87) PCT Pub. No.: WO2013/035584
PCT Pub. Date: Mar. 14, 2013

(65) Prior Publication Data
US 2014/0227986 A1 Aug. 14, 2014

(30) Foreign Application Priority Data

Sep. 9, 2011 (JP) ................................ 2011-197569

(51) Int. Cl.
| H03C 1/62 | (2006.01) |
| H04B 17/00 | (2015.01) |
| H04B 1/04 | (2006.01) |
| H04B 5/00 | (2006.01) |
| H03J 3/20 | (2006.01) |

(52) U.S. Cl.
CPC ... *H04B 1/04* (2013.01); *H03J 3/20* (2013.01); *H04B 5/0031* (2013.01); *H04B 5/0037* (2013.01); *H04B 5/0081* (2013.01)

(58) Field of Classification Search
CPC .............. H03G 3/3042; H03G 3/3047; H04B 2001/0416; H04B 17/0025; H04B 1/40; H04B 1/3822; H04B 1/406; H04B 1/44; H04B 1/54; H04W 52/52; H04W 88/02; H04M 1/72519; H04M 1/72522; H04M 1/0214; H04M 2250/12
USPC ......... 455/75–78, 115.1, 115.4, 127.1, 226.1, 455/226.4, 333, 334, 550.1
See application file for complete search history.

(56) References Cited

U.S. PATENT DOCUMENTS

| 2008/0238679 A1* | 10/2008 | Rofougaran et al. ...... 340/572.2 |
| 2009/0230944 A1* | 9/2009 | Kitamoto et al. ............. 323/318 |
| 2011/0241837 A1* | 10/2011 | Suzuki ......................... 340/10.1 |

FOREIGN PATENT DOCUMENTS

| JP | 2003-216911 | 7/2003 |
| JP | 2006-033247 | 2/2006 |

(Continued)

*Primary Examiner* — Nhan Le
(74) *Attorney, Agent, or Firm* — Hazuki International, LLC

(57) ABSTRACT

Provided is a transmission device including a transmission unit that includes an antenna coil and performs communication with an external device by electromagnetic coupling, a signal output unit that generates a signal of a predetermined frequency and outputs the generated signal to the transmission unit, a communication monitor unit that monitors information about a current flowing through the antenna coil and determines a communication state based on the monitored information, and a communication correction unit that corrects a communication characteristic based on a determination result of the communication state in the communication monitor unit.

19 Claims, 14 Drawing Sheets

11 SIGNAL SOURCE  12 OUTPUT IMPEDANCE  13 ANTENNA COIL  14 PARALLEL VARIABLE CAPACITOR
15 SERIES CAPACITOR  16,17 DC-REMOVAL CAPACITOR  21 MONITOR RESISTOR  22 COMPARATOR
23 REFERENCE POWER SUPPLY  24 ERROR AMPLIFIER  25 CHANGEOVER SWITCH

(56) References Cited

FOREIGN PATENT DOCUMENTS

| | | |
|---|---|---|
| JP | 2006-238398 | 9/2006 |
| JP | 2006-244214 | 9/2006 |
| JP | 2009-077385 | 4/2009 |
| JP | 2010-233048 | 10/2010 |
| JP | 2011-182012 | 9/2011 |

* cited by examiner

11 SIGNAL SOURCE  12 OUTPUT IMPEDANCE  13 ANTENNA COIL  14 PARALLEL VARIABLE CAPACITOR
15 SERIES CAPACITOR  16,17 DC-REMOVAL CAPACITOR  21 MONITOR RESISTOR  22 COMPARATOR
23 REFERENCE POWER SUPPLY  24 ERROR AMPLIFIER  25 CHANGEOVER SWITCH

11 SIGNAL SOURCE  12 OUTPUT IMPEDANCE  13 ANTENNA COIL  15 SERIES CAPACITOR
21 MONITOR RESISTOR  22 COMPARATOR  23 REFERENCE POWER SUPPLY
32 CHANGEOVER SWITCH  33 FIRST PARALLEL CAPACITOR  34 SECOND PARALLEL CAPACITOR

11 SIGNAL SOURCE   12 OUTPUT IMPEDANCE   15 SERIES CAPACITOR   21 MONITOR RESISTOR
22 COMPARATOR   23 REFERENCE POWER SUPPLY   43 CHANGEOVER SWITCH   44 FIRST ANTENNA COIL
45 SECOND ANTENNA COIL   46 PARALLEL CAPACITOR

11 SIGNAL SOURCE  12 OUTPUT IMPEDANCE  13 ANTENNA COIL  14 PARALLEL VARIABLE CAPACITOR  15 SERIES CAPACITOR
16,17 DC-REMOVAL CAPACITOR  21 MONITOR RESISTOR  22 COMPARATOR  25 CHANGEOVER SWITCH  56 CAPACITOR
53 REFERENCE POWER SUPPLY  54 PHASE COMPARATOR  55 RESISTOR  57 ERROR AMPLIFIER
58 PHASE DIFFERENCE REFERENCE POWER SUPPLY  59 HOLD CAPACITOR

11 SIGNAL SOURCE  13 ANTENNA COIL  15 SERIES CAPACITOR  21 MONITOR RESISTOR
22 COMPARATOR  23 REFERENCE POWER SUPPLY  24 ERROR AMPLIFIER  25 CHANGEOVER SWITCH
63 VARIABLE OUTPUT IMPEDANCE  64 PARALLEL CAPACITOR

11 SIGNAL SOURCE  12 OUTPUT IMPEDANCE  13 ANTENNA COIL  15 SERIES CAPACITOR
22 COMPARATOR  64 PARALLEL CAPACITOR  72 CHANGEOVER SWITCH  73 FIRST MONITOR RESISTOR
74 SECOND MONITOR RESISTOR  75 FIRST POWER SWITCH  76 FIRST REFERENCE POWER SUPPLY
77 SECOND POWER SWITCH  78 SECOND REFERENCE POWER SUPPLY

TRANSMISSION DEVICE, TRANSMISSION/RECEPTION DEVICE, INTEGRATED CIRCUIT, AND COMMUNICATION STATE MONITORING METHOD

CROSS REFERENCES TO RELATED APPLICATIONS

The present application is a national stage of International Application No. PCT/JP2012/071694 filed on Aug. 28, 2012 and claims priority to Japanese Patent Application No. 2011-197569 filed on Sep. 9, 2011, the disclosure of which is incorporated herein by reference.

BACKGROUND

The present disclosure relates to a transmission device, a transmission/reception device, and an integrated circuit, each of which has a function of performing non-contact communication (transmission) of information or energy by electromagnetic induction (electromagnetic coupling), and communication state monitoring methods of these devices.

Nowadays a non-contact communication system in which non-contact IC (Integrated Circuit) cards, such as a traffic ticket and electronic money, are used becomes significantly widespread. In such a non-contact communication system, a transmission signal (electromagnetic wave) emitted from a transmission antenna (a resonant circuit) of a reader/writer (hereinafter abbreviated to as R/W) device dedicated to the system is received by the electromagnetic induction using a reception antenna provided in the non-contact IC card.

In such a non-contact communication system, it is important to mutually match a frequency of a signal source of the R/W device, a resonance frequency of the transmission antenna of the R/W device, and a resonance frequency of the reception antenna (resonant circuit) of the non-contact IC card, so as to obtain good communication characteristic. However, the resonance frequency of the reception antenna of the non-contact IC card or the transmission antenna of the R/W device is varied by various factors. In this case, it is difficult to stably transmit and receive information between the non-contact IC card and the R/W device.

Thus, in the past, in the technical field of non-contact communication systems, there have been proposed various technologies for maintaining a good communication state under all conditions (see, for example, Patent Literature 1). Patent Literature 1 describes a non-contact IC card device for an electronic settlement system that performs electronic settlement by wireless communication. In the non-contact IC card device for the electronic settlement system of Patent Literature 1, there is proposed a technology for optimally controlling transmission power of a wireless transmission/reception circuit according to a distance or a position relationship between a wireless transmission/reception circuit and a non-contact R/W and a surrounding radio wave condition.

CITATION LIST

Patent Literature

Patent Literature 1: JP 2003-216911A

SUMMARY

Technical Problem

As described above, in the technical field of non-contact communication systems, in the past, there have been proposed various technologies for maintaining a good communication state, but it is preferable to optimize communication characteristic while monitoring a communication state, so as to more reliably obtain a good communication state. However, at present, a practical communication state monitoring method and a transmission/reception device capable of adjusting a communication state by using the method are not proposed.

The present disclosure has been made in consideration of the above-mentioned situation, and an object of the present disclosure is to provide a transmission device, a transmission/reception device, an integrated circuit, and a communication state monitoring method, which are capable of optimizing communication characteristic while monitoring a communication state.

Solution to Problem

In order to solve the above-mentioned problems, a transmission device of the present disclosure includes a transmission unit, a signal output unit, a communication monitor unit, and a communication correction unit, and the configuration and function of each unit are as follows. The transmission unit includes an antenna coil and performs communication with an external device by electromagnetic coupling. The signal output unit generates a signal of a predetermined frequency and outputs the generated signal to the transmission unit. The communication monitor unit monitors information about a current flowing through the antenna coil and determines a communication state based on the monitored information. The communication correction unit corrects communication characteristic based on the determination result of the communication state in the communication monitor unit.

Also, the meaning of "communication" used in the present specification includes not only information communication but also energy transmission (power transmission) performed in, for example, a wireless power transmission system. Also, the meaning of "communication state" used in the present specification includes not only a communication state at the time of non-contact information communication but also a transmission state at the time of non-contact energy transmission performed in, for example, a wireless power transmission system.

Also, a transmission/reception device of the present disclosure is configured to include a transmission function unit that has the same configuration as the transmission device of the present disclosure, and a reception function unit that includes a reception antenna and performs communication with the outside by electromagnetic coupling. Also, an integrated circuit of the present disclosure is configured to include the communication monitor unit and the communication correction unit of the transmission device of the present disclosure.

Also, a communication state monitoring method of the present disclosure is a communication state monitoring method of the transmission device of the present disclosure, and is performed in the following procedure. First, the communication monitor unit monitors information about the current flowing through the antenna coil. Subsequently, the communication monitor unit determines a communication state based on the information about the current flowing through the antenna coil.

Advantageous Effects of Invention

As described above, according to the present disclosure, the current (coil current) flowing through the antenna coil of the transmission unit of the transmission device is monitored, and the communication state is determined based on the monitoring result. Then, the communication characteristic is corrected by controlling the resonance characteristic, the output operation, and the device operation of, for example, the transmission device, based on the determination result. Thus, according to the present disclosure, the optimization of the communication characteristic can be achieved while monitoring the communication state.

Additional features and advantages are described herein, and will be apparent from the following Detailed Description and the figures.

DETAILED DESCRIPTION

Figure 1:
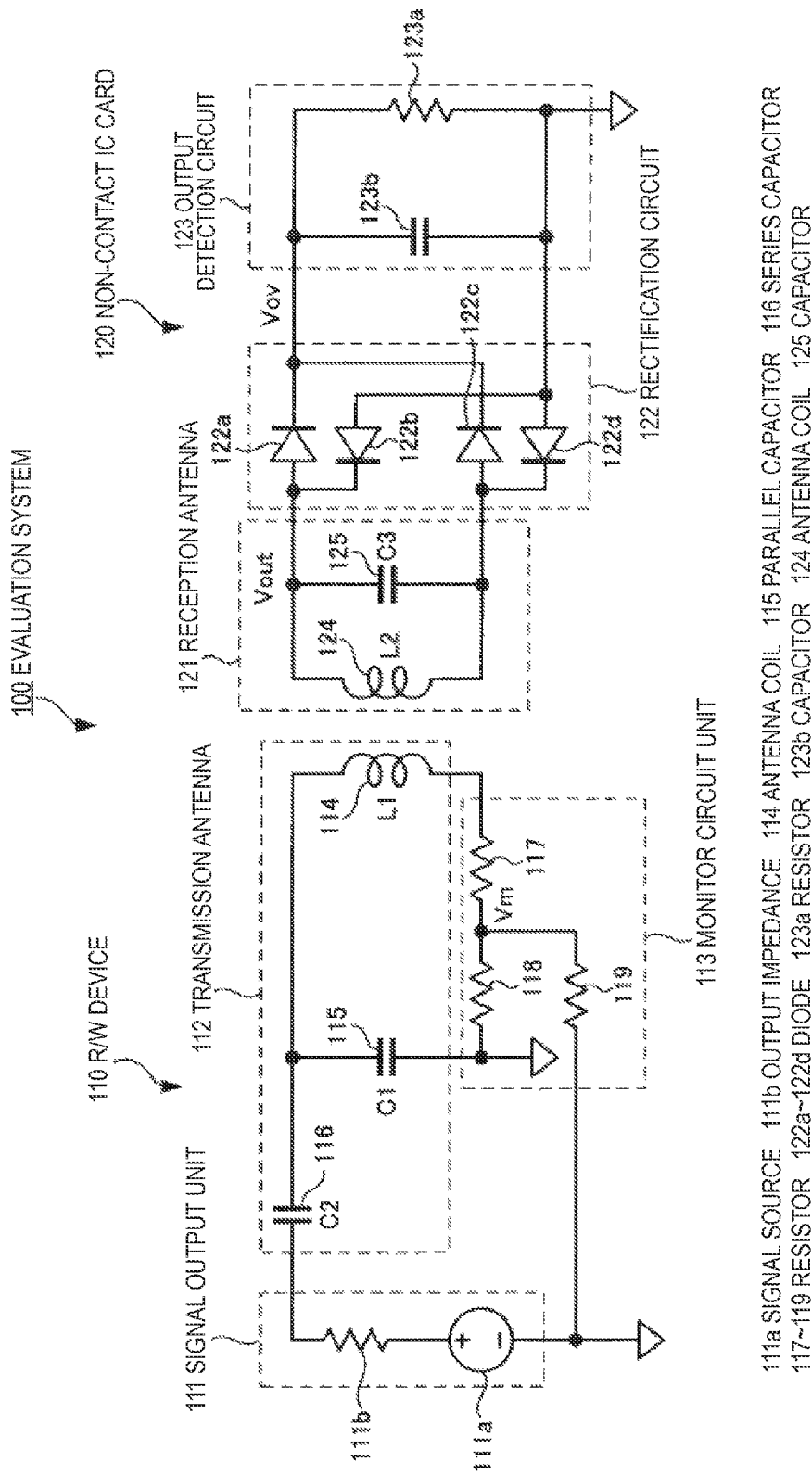
FIG. 1 is a circuit configuration diagram of a non-contact communication system used for evaluation in various verification experiments.

Hereinafter, examples of a transmission device and a communication state monitoring method according to embodiments of the present disclosure will be described in the following order with reference to the drawings. However, the present disclosure is not limited to the following examples.

1. Principle of Communication State Monitoring Method and Communication Characteristic Correcting Method 2. Various Embodiments of Transmission Device 3. Various Modifications and Various Applications <1. Principle of Communication State Monitoring Method and Communication Characteristic Correcting Method>

In a transmission device and a transmission/reception device of the present disclosure, a current flowing through an antenna coil constituting a transmission antenna (resonant circuit) is monitored, and a communication state is determined based on the monitor signal. In the following, the principle that can determine the communication state by this method will be described with reference to the results of various verification experiments.

[Factors of Resonance Frequency Deviation]

As described above, in a non-contact communication system, a resonance frequency of a reception antenna of a non-contact IC card (non-contact data carrier) or a transmission antenna of an R/W device is varied by various factors. Specifically, the following factors are taken as examples.

(1) Initial deviation due to variation in inductance of antenna coil and capacitance of capacitor, the antenna coil and the capacitor constituting a resonant circuit, (in particular, the variation in the inductance of the antenna coil is great)

(2) Deviation due to change in environmental conditions, such as temperature change (3) Deviation due to magnetic coupling between R/W device and non-contact IC card The factor (3) is a factor based on a mutual inductance (M) occurring between the transmission antenna of the R/W device and the reception antenna of the non-contact IC card. The mutual inductance M between the two sides is expressed as $M=K(L1 \times L2)^{1/2}$, where L1 is the inductance of the transmission antenna of the R/W device and L2 is the inductance of the reception antenna of the non-contact IC card. Also, K is a magnetic coupling coefficient and is a variable that varies depending on conditions, for example, a distance between the transmission antenna and the reception antenna, a size of each of the antennas, and the like. Specifically, the magnetic coupling coefficient K is increased when the distance between the transmission antenna and the reception antenna is small, and is increased when the antenna size of the transmission antenna is mutually close to the antenna size of the reception antenna.

When the magnetic coupling (K) is changed, the mutual inductance M is changed. In this case, the inductance of the antenna coil is changed, resulting in a change in the resonance frequency of the antenna ($f=1/\{2\pi(LC)^{1/2}\}$). Such a change in the resonance frequency of the antenna occurs in both the R/W device and the non-contact IC card. When the influence of the mutual inductance M is great, the following phenomena occur.

(a) In the R/W device, since impedance at a transmission frequency is changed, impedance matching between a signal source and a transmission antenna is not achieved. In this case, a coil current flowing through the transmission antenna is reduced.

(b) In the non-contact IC card, a Q factor (quality factor) at a reception frequency (=transmission frequency) is reduced (impedance is reduced), and a received voltage is decreased.

Also, the phenomena (a) and (b) are confirmed in verification experiments to be described below. Specifically, when the distance between the transmission antenna and the reception antenna is excessively small (the two sides are excessively close), the received voltage is decreased and, furthermore, when the two sides come close to contact each other, poor communication is caused. It is considered that this is mainly caused by the influence of the output reduction due to the resonance frequency deviation on the R/W device side.

In order to correct the resonance frequency deviation due to the above-mentioned factor (3), it is necessary to monitor the communication state between the R/W device and the non-contact IC card, which varies depending on conditions, such as the distance (position relationship) between the two sides, the antenna sizes of the two sides, or the like. The influence of the above-mentioned factor (3) on communication characteristics will be described below in detail with reference to the results of various verification experiments.

[Circuit Configuration of Non-contact Communication System for Evaluation]

FIG. 1 illustrates a circuit configuration of a non-contact communication system used for evaluation in various verification experiments (hereinafter, referred to as an evaluation system). Incidentally, FIG. 1 illustrates only the circuit configuration that mainly functions at the time of non-contact communication.

The evaluation system 100 is configured by an R/W device 110 for verification and a non-contact IC card 120. Incidentally, the circuit configuration of the evaluation system 100 illustrated in FIG. 1 is substantially identical to the circuit configuration of a basic communication circuit unit used in a non-contact communication system, for example, a Felica (registered trademark)/NFC (Near Field Communication) system. However, a monitor circuit unit 113, which is to be described below, is not included in an actual product.

(1) Configuration of R/W Device

The R/W device 110 includes a signal output unit 111, a transmission antenna 112 (resonant circuit), and a monitor circuit unit 113.

The signal output unit 111 is configured by a signal source 111a that outputs a signal of a predetermined frequency (13.56 MHz), and output impedance 111b having impedance of 50Ω. An output terminal of one side (terminal of "+" side) of the signal source 111a is connected to a terminal of one terminal of the output impedance 111b, and an output terminal of the other side (terminal of "−" side) of the signal source 111a is grounded. Also, a terminal of the other side of the output impedance 111b is connected to a terminal of one side of a series capacitor 116 of the transmission antenna 112 which is to be described below.

The transmission antenna 112 is configured by an antenna coil 114, a parallel capacitor 115, and the series capacitor 116. A terminal of one side of the antenna coil 114 is connected to a terminal of one side of the parallel capacitor 115 and a terminal of the other side of the series capacitor 116, and a terminal of the other side of the antenna coil 114 is grounded through two resistors 117 and 118 of the monitor circuit unit 113 which is to be described below. Also, a terminal of the other side of the parallel capacitor 115 is grounded. That is, the series circuit configured by the antenna coil 114 and the two resistors 117 and 118 is connected in parallel to the parallel capacitor 115.

Also, an inductance L1 of the antenna coil 114, a capacitance C1 of the parallel capacitor 115, and a capacitance C2 of the series capacitor 116 were set such that impedance matching was achieved between the signal output unit 111 and the transmission antenna 112. Specifically, the constants (L1, C1, and C2) of the respective circuit elements of the antenna coil 114 were set such that a matching was achieved with 50 Ω(Z=50+j0[Ω]) between the signal output unit 111 and the transmission antenna 112 with respect to the signal of 13.56 MHz. However, at this time, the constants of the respective circuit elements of the antenna coil 114 were set in such a state that there was no magnetic coupling between the transmission antenna 112 and the reception antenna 121.

Also, in various verification experiments to be described below, two types of transmission antennas 112 each having different antenna sizes (antenna coil sizes) were prepared. Therefore, with respect to the transmission antennas 112 of the respective antenna sizes, the evaluation system 100 appropriately set the capacitances (C1 and C2) of the respective capacitors such that the impedance matching was achieved between the signal output unit 111 and the transmission antenna 112.

The monitor circuit unit 113 is a circuit that monitors a coil current flowing through the antenna coil 114, and is configured by three resistors 117 to 119. The resistor 117 and the resistor 118 are connected in series and are provided between the antenna coil 114 and the ground. Also, the resistor 119 is provided between a connection point between the resistor 117 and the resistor 118, and the ground. Also, the resistor 117 and the resistor 118 are all configured by resistive elements each having a resistance of 1 Ω, and the resistor 119 is configured by a resistive element having a resistance of 50 Ω.

The monitor circuit unit 113 of the evaluation system 100 illustrated in FIG. 1 converts the coil current into a voltage and monitors the voltage value, without directly monitoring the coil current. Specifically, a voltage of the connection point between the resistor 117 and the resistor 118 is monitored as a voltage corresponding to the coil current (hereinafter, referred to as a monitor voltage Vm). Then, the evaluation system 100 determines a communication state (magnetic coupling state), based on the monitor voltage Vm.

(2) Configuration of Non-contact IC Card

The non-contact IC card 120 includes a reception antenna 121 (resonant circuit), a rectification circuit 122, and an output detection circuit 123.

The reception antenna 121 is configured by an antenna coil 124 and a capacitor 125 connected in parallel. Also, an inductance L2 of the antenna coil 124 and a capacitance C3 of the capacitor 125 were set such that impedance of the reception antenna 121 was maximized with respect to a reception signal of 13.56 MHz. However, at this time, the constants (L2 and C3) of the respective circuit elements of the antenna coil 124 were set in such a state that there was no magnetic coupling between the transmission antenna 112 and the reception antenna 121.

Also, in various verification experiments to be described below, three types of reception antennas 121 each having different antenna sizes were prepared. Thus, in the reception antennas 121 of the respective antenna sizes, the capacitance C3 of the capacitor 125 was appropriately set such that the impedance of the reception antenna 121 was maximized with respect to the reception signal of 13.56 MHz.

The rectification circuit 122 is a circuit that converts an AC signal (received voltage Vout) received by the reception antenna 121 into a DC signal (hereinafter, detection output Vov). In the evaluation system 100 illustrated in FIG. 1, the rectification circuit 122 is configured by four diodes 122a to 122d.

The output detection circuit 123 is connected in parallel to the reception antenna 121 through the rectification circuit 122, and is a circuit that detects the detection output Vov converted by the rectification circuit 122. In the evaluation system 100 illustrated in FIG. 1, the output detection circuit 123 is configured by a resistor 123a and a capacitor 123b connected in parallel. Also, herein, a resistance of the resistor 123a was 820 Ω.

(3) Antenna Size

Figures 2, 3:
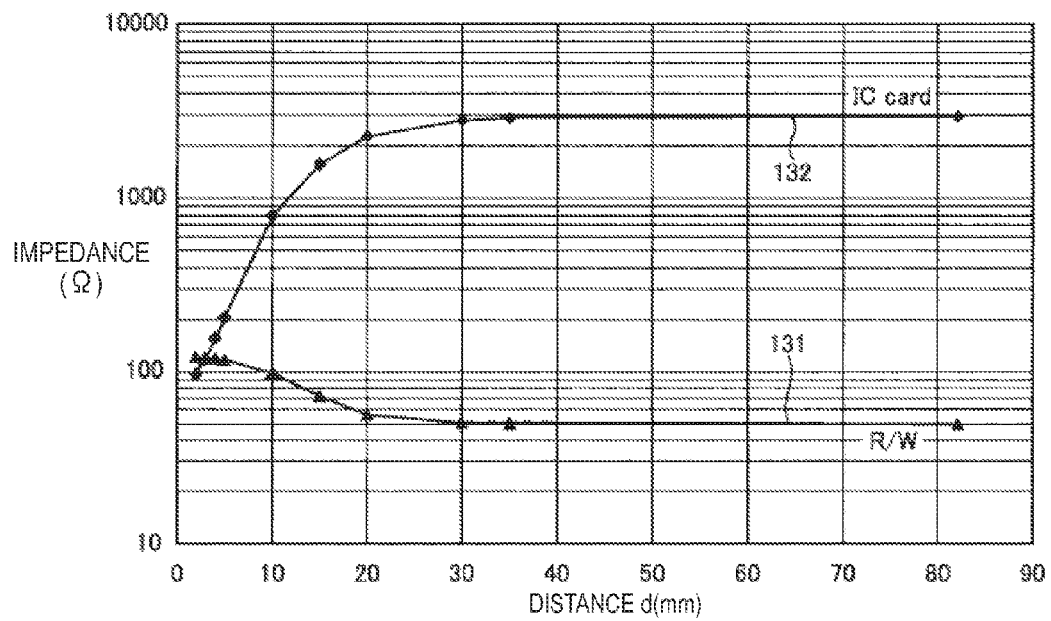
FIG. 2 is a diagram illustrating schematic configurations and sizes of antenna coils of various transmission antennas used in various verification experiments.
FIG. 3 is a diagram illustrating the measurement result of verification experiment 1.

FIG. 2 illustrates schematic configurations and antenna sizes of various transmission antennas 112 and various reception antennas 121 used in various verification experiments. Incidentally, FIG. 2 is a schematic top view of antenna coils, and the evaluation system 100 uses substantially rectangular antenna coils.

In the following verification experiments, as illustrated in FIG. 2, as the transmission antenna 112, an antenna having a (medium-size) antenna coil was prepared, in which a diameter in a long side direction was 44 mm and a diameter in a short side direction was 30 mm. Also, in the following verification experiments, as the transmission antenna 112, an antenna having a (small-size) antenna coil was prepared, in which a diameter in a long side direction was 22 mm and a diameter in a short side direction was 16 mm On the other hand, as the reception antenna 121, as illustrated in FIG. 2, an antenna having a (large-size) antenna coil was prepared, in which a diameter in a long side direction was 68 mm and a diameter in a short side direction was 38 mm. Also, in the following verification experiments, as the reception antenna 121, an antenna having a (medium-size) antenna coil was prepared, in which a diameter in a long side direction was 44 mm and a diameter in a short side direction was 30 mm. Also, in the following verification experiments, as the reception antenna 121, an antenna having a (small-size) antenna coil was prepared, in which a diameter in a long side direction was 20 mm and a diameter in a short side direction was 16 mm

[Summary of Influence of Magnetic Coupling]

In the non-contact communication system as described above, the antenna configured by the resonant circuit is generally provided in each device of a signal transmission side and a signal reception side, as illustrated in FIG. 1, so as to perform efficient non-contact communication. In such a non-contact communication system, it is said to be preferable to increase the magnetic coupling efficient K between the transmission antenna and the reception antenna and the resonance characteristic (Q factor) so as to obtain excellent communication characteristics.

It is preferable that the resonant circuit configured by the coil (L) and the capacitor (C) increases the Q factor so as to reduce loss, but the Q factor cannot be set to a large value in consideration of conditions, for example, product specification, data code, communication speed, and the like. For example, in a Mifare (registered trademark) system using a signal of 13.56 MHz, it is said to be preferable that the Q factor is equal to or less than 35. Also, in an actual mobile phone or the like, the series resonance capacitor (C2) and the parallel resonance capacitor (C1) are provided in the resonant circuit of the transmission side, as illustrated in FIG. 1, so as to achieve the impedance matching between the signal source and the resonant circuit (transmission antenna). This achieves low impedance matching of 50 Ω.

Also, as described above, the magnetic coupling (magnetic coupling coefficient K) between the R/W device and the non-contact IC card is changed by the distance between the two sides. For example, when the distance between the R/W device and the non-contact IC card is increased, the magnetic coupling rapidly becomes small, making communication difficult. For example, in the non-contact communication system, such as Felica (registered trademark), the communication becomes difficult when the distance between the R/W device and the non-contact IC card is equal to or greater than 10 cm.

On the other hand, for example, when the distance between the R/W device and the non-contact IC card is very short (when the non-contact IC card is brought into contact with the R/W device), the magnetic coupling becomes very strong. However, in this case, a large mutual inductance M is generated between the coil of the transmission antenna of the R/W device and the coil of the reception antenna of the non-contact IC card. As a result, although described below in detail in verification experiment 1, the impedance of each resonant circuit (antenna) of the R/W device and the non-contact IC card is deviated from a desired value.

That is, when the distance between the R/W device and the non-contact IC card is very short, the mutual inductance M influences both the transmission characteristic of the R/W device and the reception characteristic of the non-contact IC card. As a result, in a system that originally resonates at 13.56 MHz, there occurs a phenomenon that resonates at, for example, a lower frequency than a resonance frequency.

The magnitude of the mutual inductance $M(=K(L1 \times L2)^{1/2})$ is determined by the degree of the magnetic coupling (K) and the magnitude of the inductances of the respective antenna coils of the R/W device and the non-contact IC card. Therefore, when the combination of the R/W device and the non-contact IC card or the distance and the position relationship between the two sides are changed, the mutual inductance M is changed. Also, when the Q factor of each resonant circuit is increased, the influence by the above-described resonance frequency deviation is also increased.

The proposers of the present disclosed technology conducted various verification experiments to scrutinize the above-described influence of the magnetic coupling between the R/W device and the non-contact IC card in the non-contact communication system. Then, from the results of the various verification experiments, the proposers of the present disclosed technology found that the communication state could be accurately determined by monitoring the coil current flowing through the transmission antenna of the R/W device.

[Verification Experiment 1]

First, the verification experiment 1 investigated, in the evaluation system 100 illustrated in FIG. 1, the relationship of the distance d between the R/W device 110 and the non-contact IC card 120 and the impedances Z of the transmission antenna 112 and the reception antenna 121, when seen from the output terminal of the signal output unit 111. In the verification experiment 1, the impedances Z were measured while changing the distance d, in such a state that the coil center of the transmission antenna 112 and the coil center of the reception antenna 121 were coaxially arranged, in an opposite direction between the R/W device 110 and the non-contact IC card 120. Also, in the verification experiment 1, the shortest distance of the distance d between the R/W device 110 and the non-contact IC card 120 was set to 2 mm in consideration of the mounted state (embedded state) of the transmission antenna 112 and the reception antenna 121 into the devices.

FIG. 3 illustrates the measurement result of the verification experiment 1. FIG. 3 is a characteristic illustrating a change in the impedances Z of the transmission antenna 112 and the reception antenna 121, when seen from the output terminal of the signal output unit 111, with respect to the distance d between the R/W device 110 and the non-contact IC card 120. Also, the horizontal axis of the characteristic illustrated in FIG. 3 is the distance d, and the vertical axis thereof is the impedance Z. Also, in FIG. 3, a characteristic 131 indicated by triangular-mark points is an impedance change characteristic of the transmission antenna 112, and a characteristic 132 indicated by diamond-mark points is an impedance change characteristic of the reception antenna 121.

As is obvious from FIG. 3, when the distance d between the R/W device 110 and the non-contact IC card 120 is, for example, larger than 30 mm, the impedance of the transmission antenna 112 is 50 Ω, and the impedance of the reception antenna 121 is 3,000 Ω (maximum value). That is, this state is a state in which impedance matching of 50 Ω is achieved between the signal output unit 111 and the transmission antenna 112, and a voltage induced in the reception antenna 121 (resonant circuit) also becomes maximum.

However, when the distance d between the R/W device 110 and the non-contact IC card 120 is, for example, 30 mm or less, the impedance of the transmission antenna 112 is rapidly increased. Also, in this case, since the parallel resonance characteristic of the reception antenna 121 of the non-contact IC card 120 is also changed, the impedance of the reception antenna 121 rapidly becomes small. In this situation, since the impedance of the transmission antenna 112 is increased, the resonance frequency is lowered.

[Verification Experiment 2]

As described above, when the non-contact IC card 120 is excessively close to the R/W device 110 (the magnetic coupling is excessively large), the impedance matching on the transmission side is deviated from 50 Ω. In this case, the coil current flowing through the transmission antenna 112 is reduced. Also, when the non-contact IC card 120 is excessively close to the R/W device 110, the impedance on the reception side is lowered, and thus, the voltage induced in the reception antenna 121 (resonant circuit) is reduced. That is, when the distance d between the R/W device 110 and the non-contact IC card 120 is small, the magnetic coupling between the two sides is increased; however, on the contrary, there occurs a phenomenon that the detection output Vov on the reception side (non-contact IC card 120 side) is reduced.

In the verification experiment 2, the phenomenon was confirmed by conducting a communication experiment between the R/W device 110 and the non-contact IC card 120 of the evaluation system 100. Specifically, as in the verification experiment 1, the distance d between the R/W device 110 and the non-contact IC card 120 was changed, and, at that time, the change in the monitor voltage Vm detected by the monitor circuit unit 113 and the detection output Vov detected by the output detection circuit 123 were measured.

Also, in the verification experiment 2, as in the verification experiment 1, the distance d was changed in such a state that the coil center of the transmission antenna 112 and the coil center of the reception antenna 121 were coaxially arranged, in an opposite direction between the R/W device 110 and the non-contact IC card 120. Also, in the verification experiment 2, the monitor voltage Vm and the detection output Vov were measured by variously changing the combination of the antenna size of the transmission antenna 112 and the antenna size of the reception antenna 121 (see FIG. 2).

Figure 4:
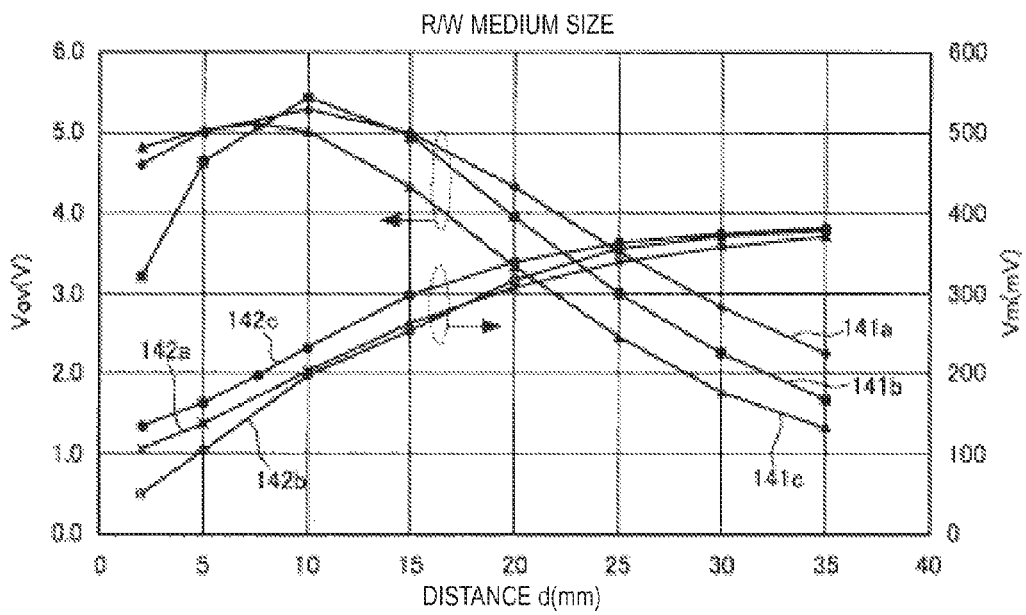
FIG. 4 is a diagram illustrating the measurement result of verification experiment 2.
Figure 5:
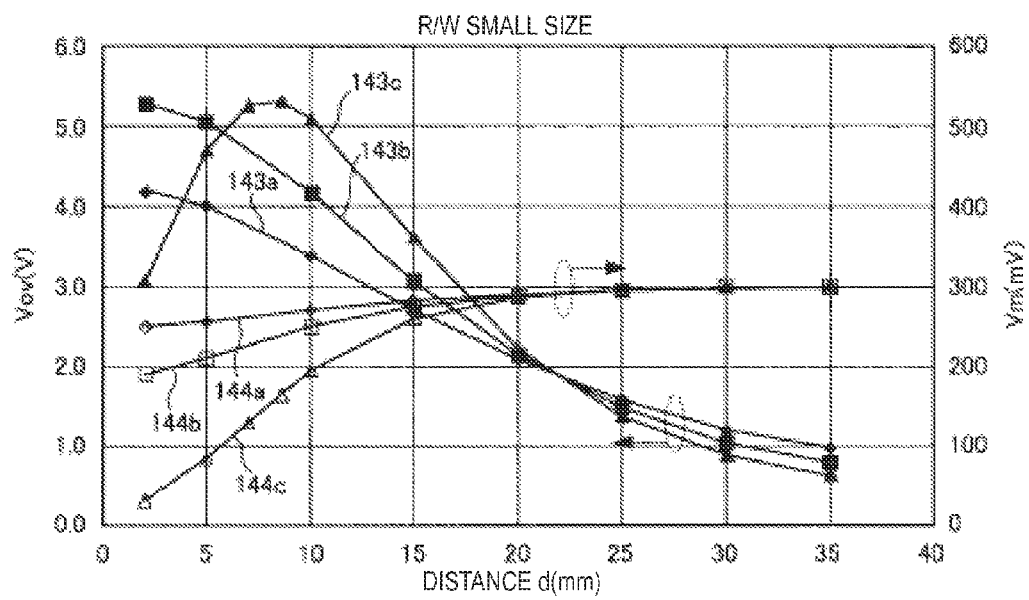
FIG. 5 is a diagram illustrating the measurement result of verification experiment 2.

FIGS. 4 and 5 illustrate the measurement results of the verification experiment 2. FIG. 4 is the measurement result when the antenna size of the transmission antenna 112 (R/W device 110) is fixed to the medium size and the antenna size of the reception antenna 121 (non-contact IC card 120) is changed to the large size, the medium size, and the small size. Also, the horizontal axis of the characteristic illustrated in FIG. 4 is the distance d, and the vertical axis thereof is the detection output Vov or the monitor voltage Vm.

Also, in FIG. 4, a characteristic 141a indicated by diamond-mark points, a characteristic 141b indicated by rectangular-mark points, and a characteristic 141c indicated by rectangular-mark points are characteristics of the detection output Vov when the antenna size of the reception antenna 121 is set to the large size, the medium size, and the small size, respectively. Also, in FIG. 4, a characteristic 142a indicated by x-mark points, a characteristic 142b indicated by white-circle-mark points, and a characteristic 142c indicated by circle-mark points are characteristics of the monitor voltage Vm when the antenna size of the reception antenna 121 is set to the large size, the medium size, and the small size, respectively.

On the other hand, FIG. 5 is the measurement result when the antenna size of the transmission antenna 112 is fixed to the small size and the antenna size of the reception antenna 121 is changed to the large size, the medium size, and the small size. Also, the horizontal axis of the characteristic illustrated in FIG. 5 is the distance d, and the vertical axis thereof is the detection output Vov or the monitor voltage Vm.

Also, in FIG. 5, a characteristic 143a indicated by diamond-mark points, a characteristic 143b indicated by rectangular-mark points, and a characteristic 143c indicated by rectangular-mark points are characteristics of the detection output Vov when the antenna size of the reception antenna 121 is set to the large size, the medium size, and the small size, respectively. Also, in FIG. 5, a characteristic 144a indicated by white-diamond-mark points, a characteristic 144b indicated by white-rectangular-mark points, and a characteristic 144c indicated by white-triangular-mark points are characteristics of the monitor voltage Vm when the antenna size of the reception antenna 121 is set to the large size, the medium size, and the small size, respectively.

In a case where the antenna size of the transmission antenna 112 (R/W device 110) is fixed to the medium size, as illustrated in the characteristics 141a to 141c of FIG. 4, the distance d at which the detection output Vov is maximized is different according to the antenna size of the reception antenna 121 (non-contact IC card 120). Also, it can be seen that, when the distance d is smaller than the distance d at which the detection output Vov is maximized, the detection output Vov is lowered without regard to the antenna size of the reception antenna 121. In contrast, as illustrated in the characteristics 142a to 142c of FIG. 4, the monitor voltage Vm monotonically decreases as the distance d becomes smaller, without regard to the antenna size of the reception antenna 121.

In a case where the antenna size of the transmission antenna 112 is fixed to the small size, as illustrated in the characteristics 143c of FIG. 5, the detection output Vov is maximized at the distance d of 8.6 mm when the antenna size of the reception antenna 121 is substantially the same as that of the transmission antenna 112. Also, when the detection output Vov is maximized, the monitor voltage Vm is about 160 mV (see the characteristic 144c). In the combination of the antenna size, when the distance d is smaller than the distance d at which the detection output Vov is maximized, the detection output Vov is lowered. Also, in a case where the antenna size of the reception antenna 121 is different from that of the transmission antenna 112, as illustrated in the characteristics 143a and 143b of FIG. 5, the detection output Vov monotonically decreases as the distance d becomes smaller. On the other hand, as illustrated in the characteristics 144a to 144c of FIG. 5, the monitor voltage Vm monotonically decreases as the distance d becomes smaller, without regard to the antenna size of the reception antenna 121.

As is obvious from the measurement result of the verification experiment 2, it can be seen that in the combination of the antenna size of the R/W device 110 and the antenna size of the non-contact IC card 120, the detection output Vov is lowered when the two sides are in close contact with each other.

The characteristic of the detection output Vov is changed by the strength of the magnetic coupling between the R/W device 110 and the non-contact IC card 120 and the degree of influence received by the magnetic coupling. Also, generally, the magnetic coupling is increased when the antenna size of the R/W device 110 is close to that of the non-contact IC card 120. Therefore, from the result of the verification experiment 2, it can be seen that when the magnetic coupling is large (when the antenna size of the R/W device 110 is close to that of the non-contact IC card 120), the decrease amount of the detection output Vov at the short distance is increased (see the characteristic 141*b* of FIG. 4).

[Verification Experiment 3]

The magnetic coupling between the R/W device 110 and the non-contact IC card 120 is also changed by the relative position relationship between the two sides, as well as the distance d between the two sides. That is, the communication characteristic is changed according to the position of the R/W device 110 where the non-contact IC card 120 is contacted, and poor communication may occur according to the touch position of the non-contact IC card 120.

Thus, in the verification experiment 3, the change in the communication characteristic was investigated when the relative position of the reception antenna 121 of the non-contact IC card 120 with respect to the transmission antenna 112 of the R/W device 110 was changed. Specifically, the relationship (position deviation characteristic) between the deviation of the relative position between the R/W device 110 and the non-contact IC card 120, and the monitor voltage Vm detected by the monitor circuit unit 113 and the detection output Vov detected by the output detection circuit 123 was investigated.

Also, in the verification experiment 3, the position deviation characteristic was measured by shifting the position of the non-contact IC card 120 in the short side direction or the long side direction of the antenna coil, in such a state that the non-contact IC card 120 was brought into contact with the R/W device 110 (the distance d between the two sides was 2 mm) Also, herein, the position deviation characteristic was measured by variously changing the combination of the antenna size of the R/W device 110 and the antenna size of the non-contact IC card 120.

Figure 6:
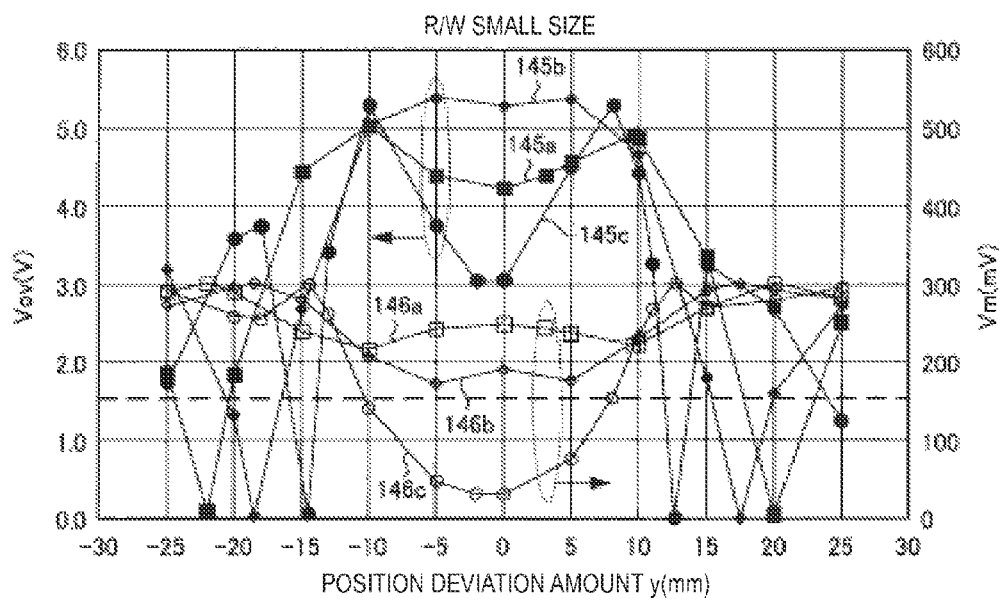
FIG. 6 is a diagram illustrating the measurement result of verification experiment 3.

FIG. 6 illustrates an example of the measurement result of the verification experiment 3. The position deviation characteristic illustrated in FIG. 6 is the position deviation characteristic when the antenna size of the R/W device 110 is fixed to the small size and the antenna size of the non-contact IC card 120 is changed to the large size, the medium size, and the small size. Also, the position deviation characteristic illustrated in FIG. 6 is a characteristic when the position of the non-contact IC card 120 is shifted in the short side direction of the coil with respect to the R/W device 110.

Also, the horizontal axis of the characteristic illustrated in FIG. 6 is the relative position deviation amount y between the R/W device 110 and the non-contact IC card 120, and the vertical axis thereof is the detection output Vov or the monitor voltage Vm. Also, in the horizontal axis of FIG. 6, the state of the position deviation amount y=0 is a state in which the coil center of the transmission antenna 112 and the coil center of the reception antenna 121 were coaxially arranged, in an opposite direction between the R/W device 110 and the non-contact IC card 120. Hereinafter, this state will be referred to as an antenna center.

Also, a positive value of the horizontal axis of FIG. 6 is the position deviation amount y when the non-contact IC card 120 is relatively shifted from the antenna center in a first direction along the short side direction of the coil with respect to the R/W device 110. A negative value of the horizontal axis of FIG. 6 is the position deviation amount y when the non-contact IC card 120 is relatively shifted from the antenna center in a second direction opposite to the first direction with respect to the R/W device 110.

Also, in FIG. 6, a characteristic 145*a* indicated by rectangular-mark points, a characteristic 145*b* indicated by diamond-mark points, and a characteristic 145*c* indicated by circle-mark points are characteristics of the detection output Vov when the antenna size of the non-contact IC card 120 is set to the large size, the medium size, and the small size, respectively. Also, in FIG. 6, a characteristic 146*a* indicated by white-rectangular-mark points, a characteristic 146*b* indicated by white-diamond-mark points, and a characteristic 146*c* indicated by white-circle-mark points are characteristics of the monitor voltage Vm when the antenna size of the non-contact IC card 120 is set to the large size, the medium size, and the small size, respectively. Also, a thick dashed line in FIG. 6 indicates a value (160 mV) of the monitor value Vm when the detection output Vov is maximized in the characteristic 143*c* of the detection output Vov illustrated in FIG. 5.

As is obvious from FIG. 6, the position deviation characteristic of the detection output Vov and the monitor voltage Vm is a characteristic that is substantially symmetrical with the position deviation amount y=0, without regard to the antenna size of the non-contact IC card 120. Also, from the position deviation characteristic illustrated in FIG. 6, it can be seen that the detection output Vov is maximized at a position deviated from the antenna center (y=0), without regard to the antenna size of the non-contact IC card 120. That is, in the position deviation characteristic illustrated in FIG. 6, the detection output Vov at the antenna center (y=0) is a value lower than the maximum value. In particular, it can be seen that, in a case the antenna size (small size) of the R/W device 110 is close to that of the non-contact IC card 120 (characteristic 145*c*: a case where the magnetic coupling is large), the decrease amount of the detection output Vov at the antenna center (y=0) is largest.

[Verification Experiment 4]

As is obvious from the position deviation characteristic illustrated in FIG. 6, in a range where the position deviation amount y is about ±10 mm, the monitor voltage Vm is equal to or lower than 160 mV (thick dashed line in FIG. 6) only when the antenna size of the non-contact IC card 120 is the small size (characteristic 146*c*). Also, from the position deviation characteristic illustrated in FIG. 6, it can be seen that the detection output Vov is maximized at the monitor voltage Vm of the vicinity of the intersection point between the characteristic 146*c* and the thick dashed line indicating Vm=160 mV, without regard to the antenna size of the non-contact IC card 120.

That is, from the characteristics of FIG. 5 (verification experiment 2) and FIG. 6 (verification experiment 3), it can be seen that, in a case where the R/W device 110 is the small size, the detection output Vov is maximized when the monitor voltage Vm is around 160 mV, without regard to the antenna size of the non-contact IC card 120. Therefore, it is supposed that, in a case where the antenna size of the R/W device 110 is constant, a strong correlation exists between the monitor voltage Vm and the detection output Vov.

Thus, in the verification experiment 4, the correlation between the monitor voltage Vm and the detection output Vov was investigated. Specifically, the correlations between the monitor voltage Vm and the detection output Vov were obtained from the measurement results of the verification experiments 2 and 3 in various combinations of the antenna size of the R/W device 110 and the antenna size of the non-contact IC card 120.

Figure 7:
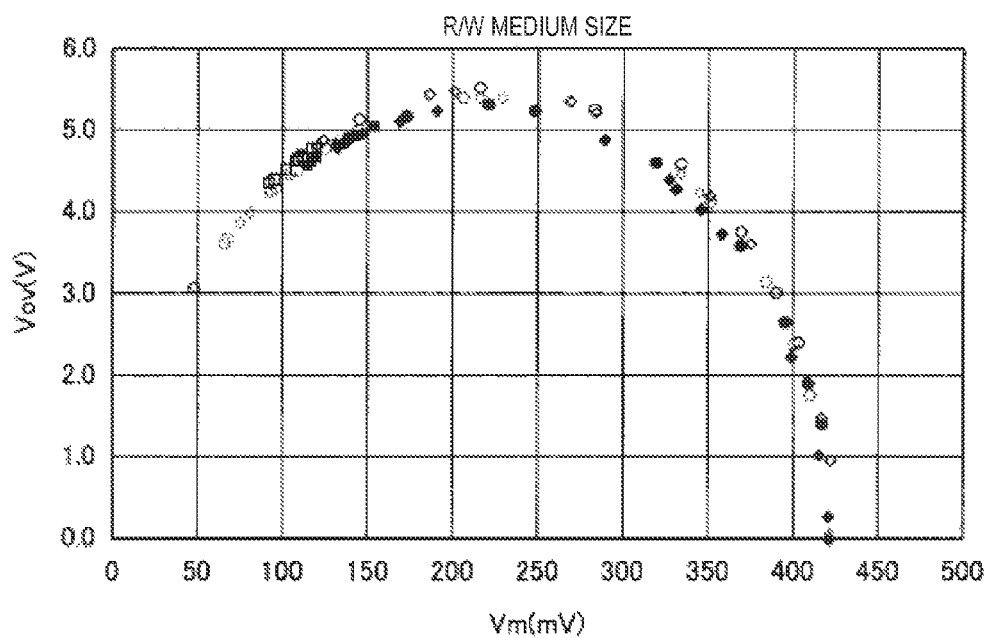
FIG. 7 is a diagram illustrating the measurement result of verification experiment 4.
Figure 8:
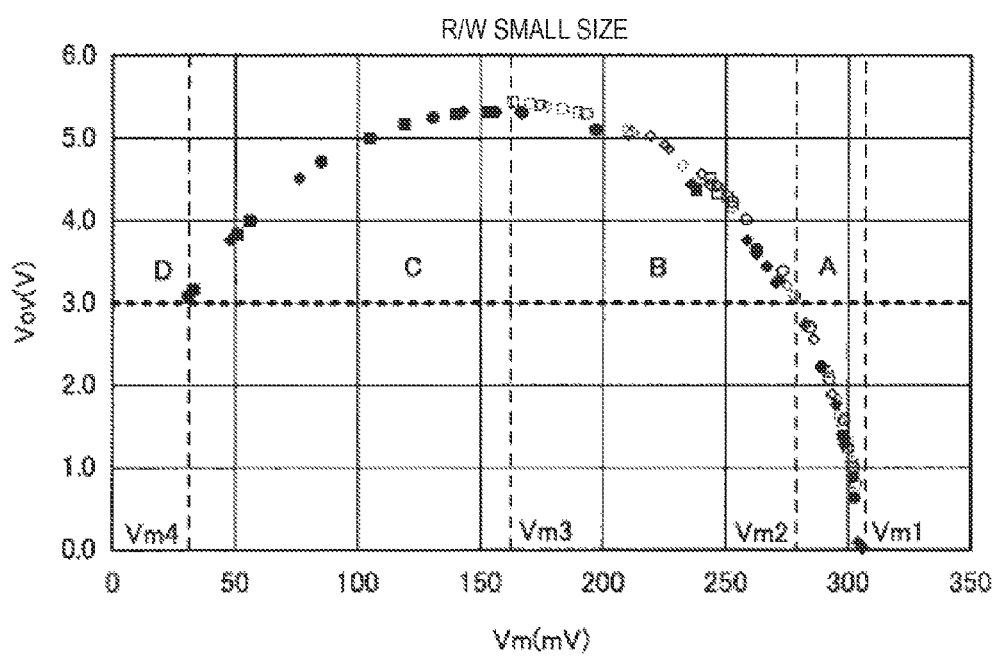
FIG. 8 is a diagram illustrating the measurement result of verification experiment 4.

FIGS. 7 and 8 illustrate the correlations. FIG. 7 is the correlation between the monitor voltage Vm and the detection output Vov when the antenna size of the R/W device 110 is fixed to the medium size and the antenna size of the non-contact IC card 120 is changed to the large size, the medium size, and the small size. Also, the horizontal axis of the characteristic illustrated in FIG. 7 is the monitor voltage Vm, and the vertical axis thereof is the detection output Vov.

The characteristic point indicated by white diamond marks in FIG. 7 is a characteristic when the antenna size of the non-contact IC card 120 is set to the large size and the position of the non-contact IC card 120 is relatively shifted in the short side direction of the coil with respect to the R/W device 110. The characteristic point indicated by white rectangular marks in FIG. 7 is a characteristic when the antenna size of the non-contact IC card 120 is set to the large size and the position of the non-contact IC card 120 is relatively shifted in the long side direction of the coil with respect to the R/W device 110. The characteristic point indicated by white circle marks in FIG. 7 is a characteristic when the antenna size of the non-contact IC card 120 is set to the large size, and the distance d between the R/W device 110 and the non-contact IC card 120 is changed to the antenna center state.

Also, the characteristic point indicated by dashed diamond marks in FIG. 7 is a characteristic when the antenna size of the non-contact IC card 120 is set to the medium size and the position of the non-contact IC card 120 is relatively shifted in the short side direction of the coil with respect to the R/W device 110. The characteristic point indicated by dashed rectangular marks in FIG. 7 is a characteristic when the antenna size of the non-contact IC card 120 is set to the medium size and the position of the non-contact IC card 120 is relatively shifted in the long side direction of the coil with respect to the R/W device 110. The characteristic point indicated by dashed circle marks in FIG. 7 is a characteristic when the antenna size of the non-contact IC card 120 is set to the medium size, and the distance d between the R/W device 110 and the non-contact IC card 120 is changed to the antenna center state.

Furthermore, the characteristic point indicated by diamond marks in FIG. 7 is a characteristic when the antenna size of the non-contact IC card 120 is set to the small size and the position of the non-contact IC card 120 is relatively shifted in the short side direction of the coil with respect to the R/W device 110. The characteristic point indicated by rectangular marks in FIG. 7 is a characteristic when the antenna size of the non-contact IC card 120 is set to the small size and the position of the non-contact IC card 120 is relatively shifted in the long side direction of the coil with respect to the R/W device 110. The characteristic point indicated by circle marks in FIG. 7 is a characteristic when the antenna size of the non-contact IC card 120 is set to the small size, and the distance d between the R/W device 110 and the non-contact IC card 120 is changed to the antenna center state.

On the other hand, FIG. 8 is the correlation between the monitor voltage Vm and the detection output Vov when the antenna size of the R/W device 110 is fixed to the small size and the antenna size of the non-contact IC card 120 is changed to the large size, the medium size, and the small size. Also, the horizontal axis of the characteristic illustrated in FIG. 8 is the monitor voltage Vm, and the vertical axis thereof is the detection output Vov. Also, in FIG. 8, a threshold voltage (3.0 V) when driving an LSI (Large Scale Integration: not illustrated) inside the non-contact IC card 120 is also indicated by a thick dashed line.

The characteristic point indicated by white diamond marks in FIG. 8 is a characteristic when the antenna size of the non-contact IC card 120 is set to the large size and the position of the non-contact IC card 120 is relatively shifted in the short side direction of the coil with respect to the R/W device 110. The characteristic point indicated by white rectangular marks in FIG. 8 is a characteristic when the antenna size of the non-contact IC card 120 is set to the large size and the position of the non-contact IC card 120 is relatively shifted in the long side direction of the coil with respect to the R/W device 110. The characteristic point indicated by white circle marks in FIG. 8 is a characteristic when the antenna size of the non-contact IC card 120 is set to the large size, and the distance d between the R/W device 110 and the non-contact IC card 120 is changed to the antenna center state.

Also, the characteristic point indicated by dashed diamond marks in FIG. 8 is a characteristic when the antenna size of the non-contact IC card 120 is set to the medium size and the position of the non-contact IC card 120 is relatively shifted in the short side direction of the coil with respect to the R/W device 110. The characteristic point indicated by dashed rectangular marks in FIG. 8 is a characteristic when the antenna size of the non-contact IC card 120 is set to the medium size and the position of the non-contact IC card 120 is relatively shifted in the long side direction of the coil with respect to the R/W device 110. The characteristic point indicated by dashed circle marks in FIG. 8 is a characteristic when the antenna size of the non-contact IC card 120 is set to the medium size, and the distance d between the R/W device 110 and the non-contact IC card 120 is changed to the antenna center state.

Furthermore, the characteristic points indicated by diamond marks in FIG. 8 is a characteristic when the antenna size of the non-contact IC card 120 is set to the small size and the position of the non-contact IC card 120 is relatively shifted in the short side direction of the coil with respect to the R/W device 110. The characteristic point indicated by rectangular marks in FIG. 8 is a characteristic when the antenna size of the non-contact IC card 120 is set to the small size and the position of the non-contact IC card 120 is relatively shifted in the long side direction of the coil with respect to the R/W device 110. The characteristic point indicated by circle marks in FIG. 8 is a characteristic when the antenna size of the non-contact IC card 120 is set to the small size, and the distance d between the R/W device 110 and the non-contact IC card 120 is changed to the antenna center state. Also, as described in the verification experiment 4, the characteristic points of the position deviation characteristics of FIGS. 7 and 8 were measured in such a state that the R/W device 110 and the non-contact IC card 120 were closely contacted with each other (the distance d between the two sides was 2 mm)

As is obvious from the characteristics illustrated in FIGS. 7 and 8, it can be seen that a strong correlation exists between the detection voltage Vov and the monitor voltage Vm, without regard to the distance d between the R/W device 110 and the non-contact IC card 120 and the relative position between the two sides. Specifically, it can be seen that the correlation characteristic of the detection voltage Vov and the monitor voltage Vm is expressed by a single parabolic characteristic.

Also, as illustrated in FIGS. 7 and 8, the value of the monitor voltage Vm at which the detection output Vov is maximized is different depending on the antenna size of the R/W device 110. However, it can be seen that, if the antenna size of the R/W device 110 is determined, the monitor voltage Vm at which the detection output Vov is maximized is constant without regard to the antenna size of the non-contact IC card.

Herein, the relationship between the correlation characteristic between the detection output Vov and the monitor voltage Vm, and the communication state will be described below with reference to FIG. 8.

(1) Region A

A region A of FIG. 8 from a maximum value Vm1 of the monitor voltage Vm to a monitor voltage Vm2 at which the detection output Vov is 3.0 V (threshold value of the driving voltage of the LSI) is a region where the distance d between the R/W device 110 and the non-contact IC card 120 is large (long distance). Therefore, in the region A, it is difficult to induce a voltage enough to drive the LSI in the non-contact IC card 120, and it is impossible to obtain a good communication state. However, in a case where the LSI of the reception side (non-contact IC card 120 side) is operated by not received power but a battery, the detection output Vov is 3.0 V or lower (for example, 1.5 V or the like) and good communication is possible.

Also, the case where the monitor voltage Vm is around the maximum value Vm1 includes a communication state of a case where no non-contact IC card (no magnetic coupling) exists within a communicable range of the R/W device. Therefore, whether the non-contact IC card exists within the communicable range of the R/W device can be determined by determining whether the monitor voltage Vm is a value around the maximum value Vm1.

(2) Region B

A region B of FIG. 8 from the monitor voltage Vm2 to a monitor voltage Vm3 at which the detection output Vov is maximized is a region where the distance d between the R/W device 110 and the non-contact IC card 120 is suitable for non-contact communication (medium distance), and is a region where good communication is obtained. The region B corresponds to a range where the distance d is 10 to 25 mm, that is, a range where good impedance characteristic is obtained in, for example, the impedance characteristic of FIG. 3. Thus, in the region B, good resonance characteristic (impedance matching) is obtained, and good communication state is obtained.

Herein, the communication state of the region B will be described below in more detail. In the non-contact communication system, when the distance d between the R/W device 110 and the non-contact IC card 120 is close, the magnetic coupling becomes strong and the antenna of the non-contact IC card 120 receives the magnetic energy the R/W device 110 generates. Therefore, a current flows through the antenna coil of the non-contact IC card 120, and a voltage Vout is induced in the reception antenna 121. Simultaneously, in the antenna coil of the R/W device 110, the coil current is reduced by a counter electromotive force caused by the antenna coil of the non-contact IC card 120 side. That is, during the non-contact communication, the magnetic energy of the transmission side is absorbed on the reception side, and thus, the coil current flowing through the transmission antenna 112 of the R/W device 110 is reduced.

In the region B of FIG. 8, since the influence of the mutual inductance M given to the transmission/reception characteristic (communication characteristic) by the electromagnetic induction as described above is slight, it is considered that the magnetic energy generated in the transmission side or the impedance of the reception side are also almost constant. Also, in the region B, as illustrated in FIG. 8, it is possible to induce the voltage enough to drive the LSI in the non-contact IC card 120.

Thus, in the communication state corresponding to the region B, the detection output Vov and the magnetic coupling are moderate and good resonance characteristic is obtained.

(3) Region C

In FIG. 8, a region C from the monitor voltage Vm3 at which the detection output Vov is maximized to a monitor voltage Vm4 at which the detection output Vov is 3.0 V is a region where the distance d between the R/W device 110 and the non-contact IC card 120 is small (short distance). The region C corresponds to a range where the distance d is 2 to 10 mm, that is, a range where each impedance Z of the transmission antenna 112 and the reception antenna 121, when seen from the signal source, is rapidly changed in, for example, the impedance characteristic of FIG. 3.

In the region C, it is possible to induce a voltage enough to drive the LSI in the non-contact IC card 120, and it is possible to obtain a moderate detection output Vov. However, the magnetic coupling between the R/W device 110 and the non-contact IC card 120 becomes excessive, and the resonance characteristic (impedance) is changed, as described in the verification experiment 1 (FIG. 3).

That is, in the region C, the magnetic energy is reduced by the impedance deviation on the transmission side, and the performance of converting the reception signal into the voltage is reduced by the impedance deviation on the reception side (influence of the minus factor). Also, in the region C, in addition to the influence of the minus factor, there is also the influence of the plus factor that the magnetic coupling becomes strong because the distance d between the R/W device 110 and the non-contact IC card 120 is small. However, the region C is a region where the influence of the minus factor described above exceeds the influence of the plus factor described above. Thus, in the region C, when the magnetic coupling is increased (the distance d between the R/W device 110 and the non-contact IC card 120 is reduced), there occurs an inversion phenomenon that the detection output Vov is not improved but lowered.

Also, the monitor circuit unit 113 monitors the monitor voltage Vm as described above, but, in practice, this is equivalent to the monitoring of the coil current flowing through the antenna coil 114 of the R/W device 110. The change in the coil current reflects two influences: the phenomenon that the coil current is reduced because the energy is absorbed into the non-contact IC card 120 by the mutual inductance M, and the phenomenon that the coil current itself is reduced by the impedance deviation of the R/W device 110.

However, as illustrated in FIGS. 7 and 8, in a case where the antenna size of the R/W device 110 is fixed, the monitor voltage Vm (Vm2 in FIG. 8) at which the detection voltage Vov is maximized is substantially constant, even when the non-contact IC card 120 combined with the R/W device 110 is changed. Therefore, it is considered that the main factor of the inversion phenomenon of the detection output Vov in the region C is because the impedance of the transmission side is greatly changed by the mutual inductance M, and the coil current itself of the R/W device 110 is reduced (the influence of the latter factor).

Also, as illustrated in the characteristic 143*a* and the characteristic 143*b* of the detection output Vov in FIG. 5 (verification experiment 2), the above-described inversion phenomenon may not occur even when the distance d between the R/W device 110 and the non-contact IC card 120 is reduced. As illustrated in FIG. 5, it can be see that such a combination of the R/W device 110 and the non-contact IC card 120 is more slowly than the change in the monitor voltage Vm with respect to the distance d. Therefore, in the non-contact communication system of such a combination, it is considered that the magnetic coupling between the R/W device 110 and the non-contact IC card 120 is small, and the mutual inductance M generated when the two sides come close is small.

(4) Region D

A region D of the monitor voltage Vm that is lower than the monitor voltage Vm4 in FIG. 8 is a region where the magnetic coupling is more excessive than the region C, and is a region where it is difficult to induce the voltage enough to drive the LSI. Thus, the region D is a poor communication region because the change in the resonance characteristic is more increased and the communication characteristic is also degraded.

[Verification Experiment 5]

In the verification experiment 5, the same circuit as the evaluation system 100 illustrated in FIG. 1 was configured by a circuit simulator, and the correlation between the coil current flowing through the antenna coil of the R/W device (which corresponds to the monitor voltage Vm) and the detection output Vov was obtained. Also, in the verification experiment 5, the antenna size of the R/W device was set to the medium size.

Figure 9:
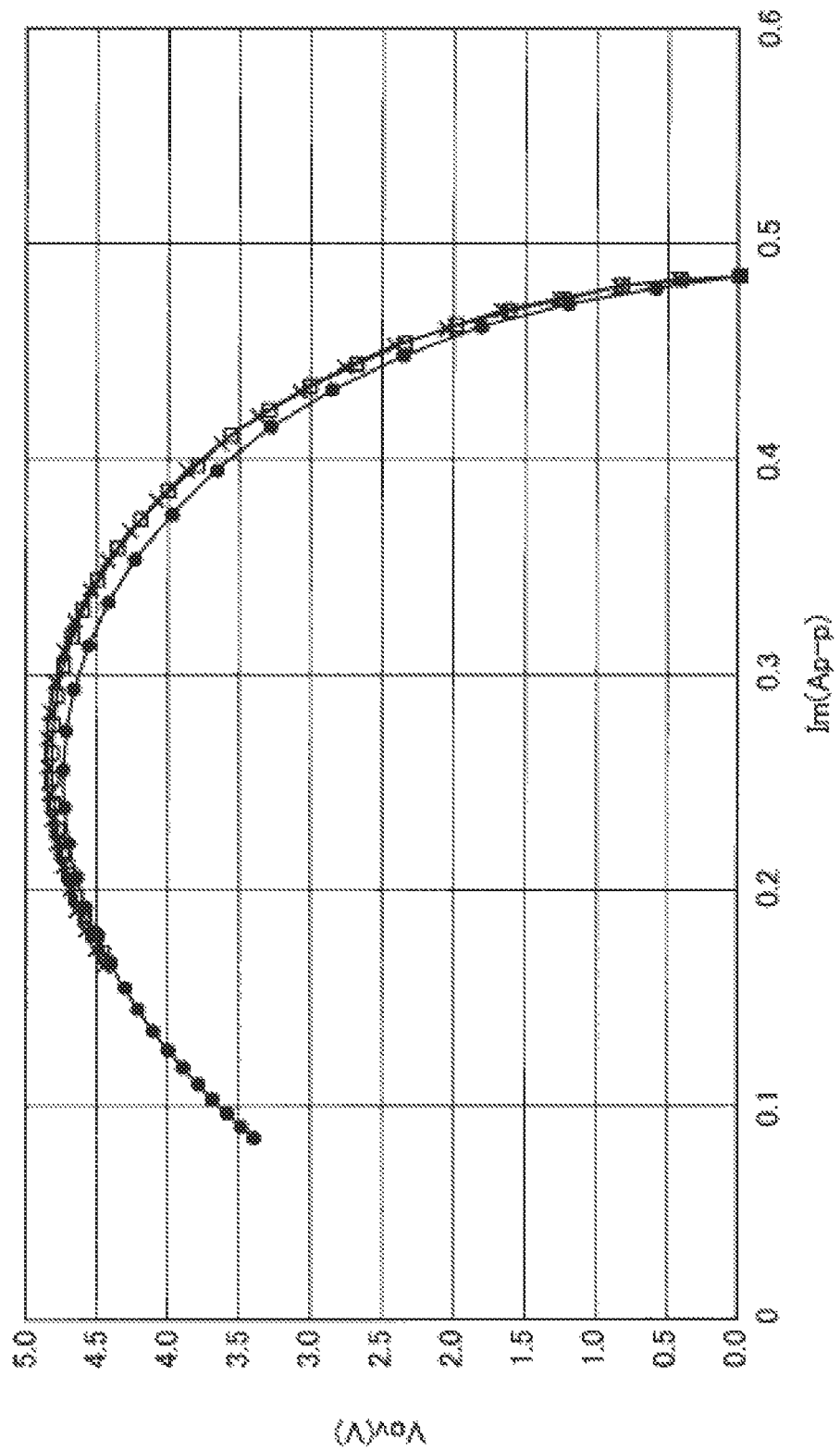
FIG. 9 is a diagram illustrating the measurement result of verification experiment 5.

FIG. 9 illustrates the calculation result of the verification experiment 5. Also, FIG. 9 is a correlation characteristic between the monitor current Im (coil current flowing through the antenna coil of the R/W device) and the detection output Vov. The horizontal axis is the monitor current Im, and the vertical axis is the detection output Vov. Also, in FIG. 9, a characteristic indicated by x-mark points, a characteristic indicated by white-rectangular-mark points, and a characteristic indicated by circle-mark points are correlation characteristics when the antenna size of the non-contact IC card is set to the large size, the medium size, and the small size, respectively.

As is obvious from the comparison between FIG. 9 and FIGS. 7 and 8, it can be seen that even in the simulation analysis, as in the actual measurement result of the verification experiment 4, the parabolic correlation characteristic is obtained between the monitor current Im and the detection output Vov. Also, as is obvious from FIGS. 7 to 9, the detection output Vov is maximized at the value (Vm3 in FIG. 8) of the monitor value corresponding to about half the maximum value of the monitor signal (monitor voltage Vm or monitor current Im). That is, it can be seen that, when the antenna size of the R/W device is determined, the optimum communication state is obtained, without regard to the antenna size of the non-contact IC card, if the resonance characteristic of the R/W device is controlled such that the value of the monitor signal has a value (optimum value) corresponding to about half the maximum value.

Also, in the verification experiment 5, when the Q factor of the transmission antenna (resonant circuit) of the R/W device was changed, the correlation characteristic between the monitor current Im and the detection output Vov was obtained by the simulation analysis. Also, herein, the Q factor was changed to 5, 10, 15, 20, 25, and 30. In each Q factor, the correlation characteristic between the monitor current Im and the detection output Vov was obtained by changing the magnetic coupling coefficient K in the range of 0.01 to 0.99.

Figure 10:
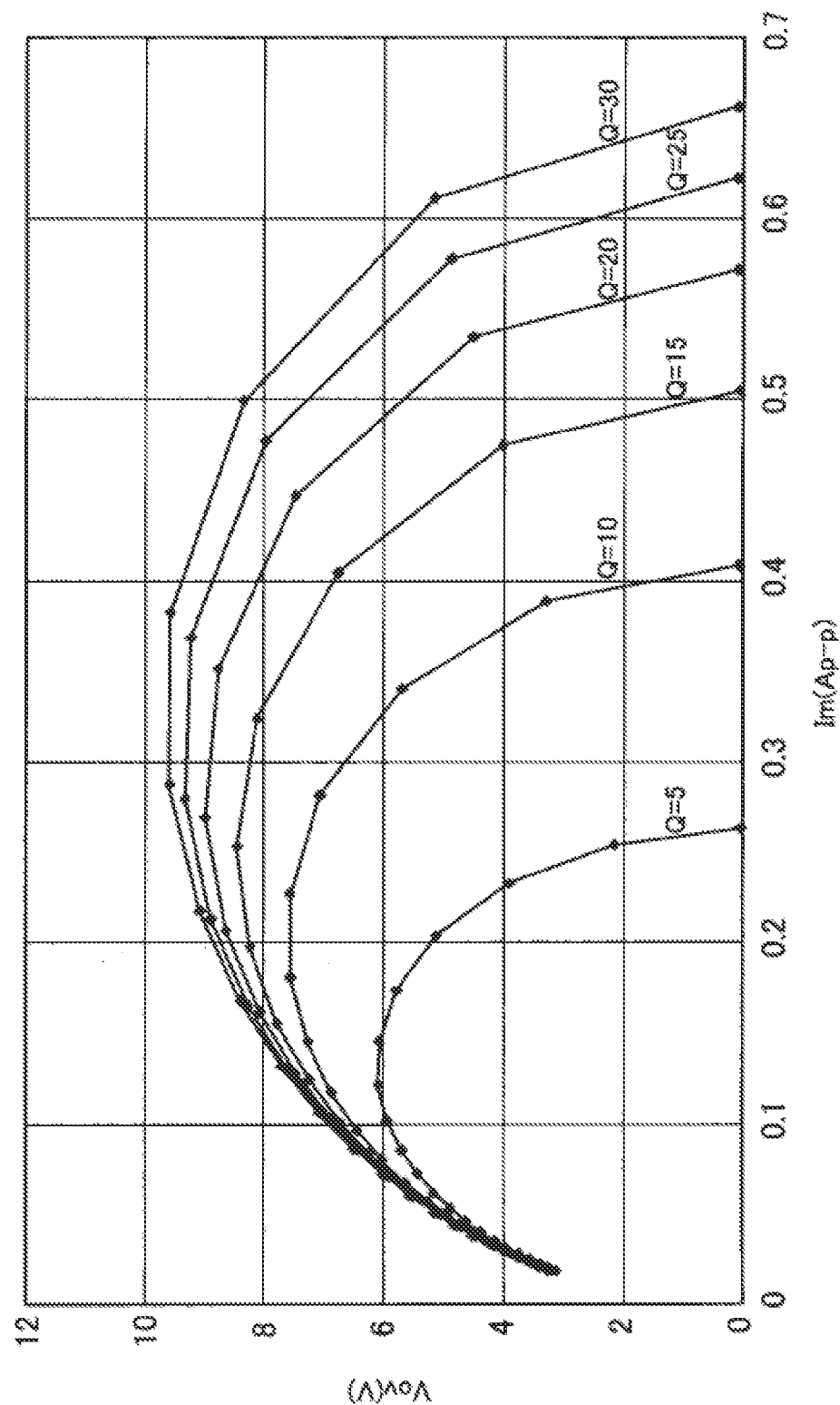
FIG. 10 is a diagram illustrating the measurement result of verification experiment 5.

FIG. 10 illustrates the simulation result of the correlation characteristic between the monitor current Im and the detection output Vov when the Q factor of the transmission antenna (resonant circuit) is changed. Also, the horizontal axis of the correlation characteristic illustrated in FIG. 10 is the monitor current Im, and the vertical axis thereof is the detection output Vov.

As is obvious from FIG. 10, when the Q factor of the transmission antenna is increased, the maximum value of the monitor current Im (coil current) and the optimum value (value at which the detection output Vov is maximized) can be increased. When the Q factor of the transmission antenna is increased, the received voltage Vout induced in the reception antenna (resonant circuit) of the non-contact IC card is also increased, and thus, the detection output Vov can also be increased. Also, it can be seen from FIG. 10 that the correlation characteristic between the monitor current Im and the detection output Vov at each Q factor is all the substantially parabolic characteristic, and the maximum value of the monitor current Im (value at which the detection output Vov is maximized) is about half the maximum value of the monitor current Im.

It can be seen from the above various verification experiments that the communication state can be determined by monitoring information about the current (monitor current Im) flowing through the transmission antenna of the R/W device or the corresponding monitor voltage Vm, that is, the current flowing through the transmission antenna. Also, from the results of the above various verification experiments, it is estimated that the optimum value of the monitor signal (monitor current Im or monitor voltage Vm) for maximizing the detection output Vov is half the maximum value of the monitor signal.

Also, the method of determining the communication state based on the above-described information (monitor signal) about the current flowing through the transmission antenna of the R/W device also obtains the following advantages.

In the R/W device, for example, in a case where the coil current is reduced by the impedance deviation, a possible countermeasure is to increase the coil current by increasing the voltage of the signal source or reducing the output impedance of the signal source. However, the processing operation of monitoring the impedance in real time has a very large load in terms of circuit and is unsuitable for the non-contact communication system that transmits signals to a simple circuit. Also, the processing operation of monitoring the resonance frequency deviation as well as the impedance deviation also has a very large load.

In contrast, in the present disclosure, as described above, the communication state is determined using the correlation characteristic between the coil current flowing through the antenna coil of the R/W device and the detection output of the non-contact IC card. At this time, if the configuration of the R/W is determined, the communication state can be estimated by just monitoring the coil current, without regard to the configuration of the non-contact IC card (antenna size, inductance of antenna, Q factor of antenna). Thus, the communication state monitoring technology according to the present disclosure can determine the quality of the communication state more easily than the above-described technology of monitoring the impedance or the resonance frequency deviation.

[Summary of Communication Characteristic Correcting Method]

As described above, the communication state can be determined by monitoring the information (monitor signal) about the current flowing through the transmission antenna of the R/W device. Specifically, as described in FIG. 8, where the current communication state is among the regions A, B, C and D can be determined by the value of the monitor voltage Vm. Herein, the summary of the method (countermeasure) for correcting the communication characteristic in the communication state of the region other than the region B of FIG. 8 (region where good communication characteristic can be obtained) will be described below.

(1) Countermeasure in Region A

The region A (in particular, the region where the monitor voltage Vm is around the maximum value Vm1) is a region of a communication state in which no non-contact IC card (no magnetic coupling) exists within the communicable range of the R/W device, or the magnetic coupling is very small even though the non-contact IC card exists. Thus, as the countermeasure against the communication state of the latter, there is a method of increasing the transmission output of the R/W device.

Also, as the method of increasing the transmission output of the R/W device, for example, a method of increasing the coil current by increasing the signal level of the transmission signal or increasing the coil current by reducing the output impedance of the signal output unit can be used.

(2) Countermeasure in Region C

The region C is a region of a state in which the distance d between the non-contact IC card and the R/W device is smaller than the optimum value thereof. In the communication state of the region C, as described above, the resonance characteristic is changed and the transmission output is lowered by the influence of the mutual inductance M.

Thus, in a case where the communication state is in the state of the region C, the communication state can be corrected (adjusted) to a good state (state of the region B) by the following two countermeasures.

(a) To correct the resonance frequency deviation by changing the resonance characteristic (to increase the resonance frequency)

(b) To increase the transmission output by increasing the coil current flowing through the transmission antenna (3) Countermeasure in Region D The region D is a region where the influence of the magnetic coupling is very great and the detection output Vov is low, and is a poor communication region. As the countermeasure against this case, for example, the countermeasure (a) of the region C (method of correcting the resonance characteristic) can be applied. However, according to the configuration of the R/W device, the countermeasure (a) may not correct the poor communication state of the region D to the good communication state of the region B. In this case, an error to the effect that the communication is poor can be displayed on the R/W device.

<2. Various Embodiments of Transmission Device>

Next, various embodiments of the R/W device (transmission device) capable of correcting the communication characteristic while monitoring the communication state by the above-described communication state monitoring method of the present disclosure will be described below with reference to the drawings.

[First Embodiment]

In the first embodiment, a configuration example of an R/W device that determines whether the communication state is in the region B or the region C of FIG. 8 and corrects the resonance frequency deviation by changing the resonance characteristic (communication characteristic) of the transmission antenna, based on the determination result (monitoring result), will be described below. That is, in the present embodiment, a configuration example of an R/W device that improves the resonance frequency deviation when the distance d between the R/W device and the non-contact IC card is small and the influence of the mutual inductance M is great will be described below. Also, in the present embodiment, the resonance characteristic of the transmission antenna of the R/W device, that is, the resonance frequency deviation, is corrected by changing the capacitance of the parallel capacitor constituting the resonant circuit.

Also, in the present embodiment, since it is determined whether the communication state is in the region B or the region C of FIG. 8 (good communication state/poor communication state), a value (optimum value) corresponding to half the maximum value of the monitor signal (monitor voltage Vm) is used as a determination threshold value. Also, the maximum value (optimum value) of the monitor signal is changed according to the deviation of the constants (capacitance and inductance) of each circuit element constituting the transmission antenna, but the maximum value of the monitor signal can be easily and accurately measured in each R/W device. Thus, the communication state monitoring method of the present embodiment can easily and accurately determine whether the communication state is good or poor in each R/W device.

(1) Configuration of R/W Device

Figure 11:
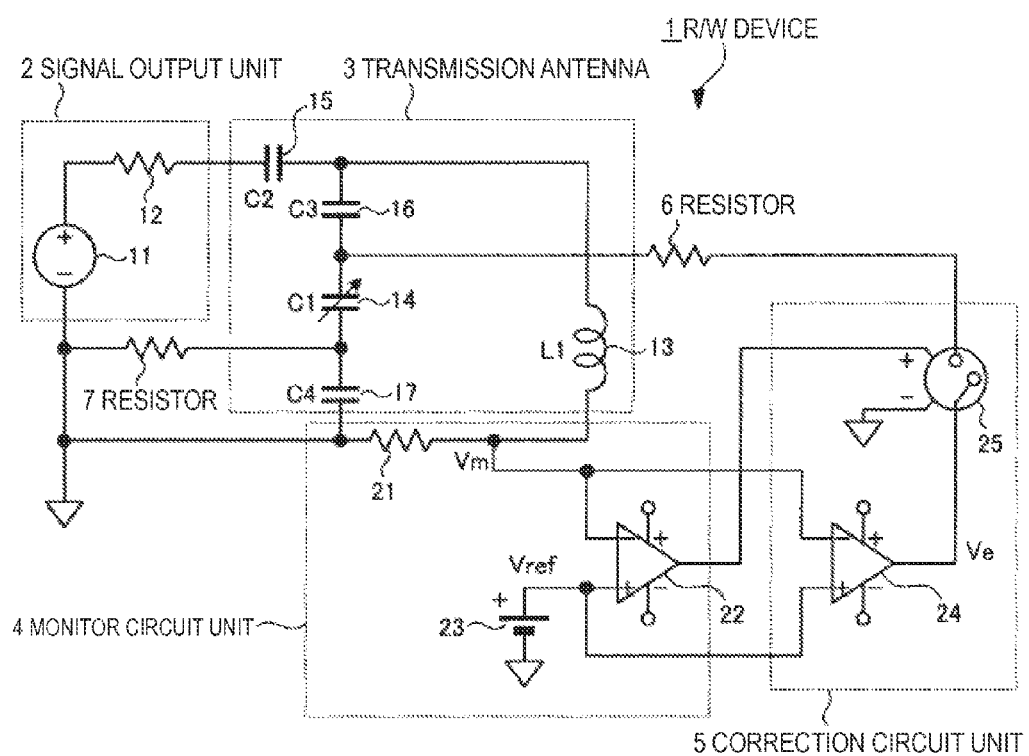
FIG. 11 is a circuit configuration diagram of an R/W device according to a first embodiment.

FIG. 11 illustrates a circuit configuration of an R/W device according to a first embodiment. The R/W device (transmission device) 1 includes a signal output unit 2, a transmission antenna 3 (transmission unit), a monitor circuit unit 4 (communication monitor unit), a correction circuit unit 5 (communication correction unit), and two resistors 6 and 7.

The signal output unit 2 is configured by a signal source 11 that generates and outputs a signal of a predetermined frequency (13.56 MHz), and output impedance 12 having impedance of 50 Ω. An output terminal of one side (terminal of "+" side) of the signal source 11 is connected to a terminal of one side of the output impedance 12, and an output terminal of the other side (terminal of "−" side) of the signal source 11 is grounded. Also, a terminal of the other side of the output impedance 12 is connected to a terminal of one side of a series capacitor 15 of the transmission antenna 3 which is to be described below. Also, the signal source 11 is mounted as an LSI in an actual circuit.

The transmission antenna 3 is configured by an antenna coil 13, a parallel variable capacitor 14, a series capacitor 15, and two DC-removal capacitors 16 and 17. Also, in the present embodiment, the antenna size of the transmission antenna 3 (antenna coil 13) is set to the small size (see FIG. 2).

In the present embodiment, the DC-removal capacitor 16, the parallel variable capacitor 14, and the DC-removal capacitor 17 are serially connected in this order. Also, a terminal of one side (DC-removal capacitor 16 side) of the series circuit of the three capacitors is connected to a terminal of the other side of the series capacitor 15 and a terminal of one side of the antenna coil 13. Also, a terminal of the other side (DC-removal capacitor 17 side) of the series circuit of the three capacitors is grounded and is connected to a terminal of the other side of the antenna coil 13 through a monitor resistor 21 of the monitor circuit unit 4 which is to be described below.

The parallel variable capacitor 14 is configured by a variable capacitive element, whose capacitance is reduced by adding a bias voltage (control voltage). For example, the parallel variable capacitor 14 can be configured by a thin-film capacitor using a ferroelectric, a diode called a varicap, or the like. Also, the two DC-removal capacitors 16 and 17 are capacitors provided so that the control voltage applied to the parallel variable capacitor 14 cannot be applied to the antenna coil 13. Thus, the capacitances C3 and C4 of the two DC-removal capacitors 16 and 17 are all set to at least ten times the capacitance C 1 of the parallel variable capacitor 14.

Also, in the present embodiment, the inductance L1 of the antenna coil 13, the capacitance of the series circuit configured by the three capacitors, and the capacitance C2 of the series capacitor 15 are set such that the impedance matching is achieved between the signal output unit 2 and the transmission antenna 3. Specifically, in such a state that there is no magnetic coupling to the non-contact IC card, the constants (L1 and C1 to C4) of the respective circuit elements of the transmission antenna 3 are set such that the matching can be achieved with 50 Ω between the signal output unit 2 and the transmission antenna 3 with respect to a signal of 13.56 MHz.

The monitor circuit unit 4 is a circuit that monitors the coil current flowing through the antenna coil 13. The monitor circuit unit 4 includes a monitor resistor 21, a comparator 22, and a reference power supply 23.

The monitor resistor 21 is provided between the antenna coil 13 and the ground. In the present embodiment, due to the monitor resistor 21, the coil current flowing through the antenna coil 13 is converted into the voltage (monitor voltage Vm: information about the current flowing through the antenna coil), and the communication state is determined based on the converted monitor voltage Vm. Also, in the present embodiment, the resistance of the monitor resistor 21 is 1 Ω.

An input terminal of "+" side of the comparator 22 is connected to an output terminal of the reference power supply 23, and an input terminal of "−" side is connected to a connection point between the antenna coil 13 and the monitor resistor 21. Also, an output terminal of the comparator 22 is connected to a changeover switch 25 of the correction circuit unit 5 which is to be described below. The comparator 22 compares the monitor voltage Vm with a reference voltage Vref output from the reference power supply 23, and outputs the comparison result to the changeover switch 25 of the correction circuit unit 5.

Also, in the present embodiment, as described above, since the size of the antenna coil 13 is set to the small size and it is determined whether the communication state is in the region B or the region C of FIG. 8, the reference voltage Vref (optimum value of the monitor voltage Vm) is 160 mV (see FIG. 8).

The correction circuit unit 5 includes an error amplifier 24 and the changeover switch 25.

An input terminal of "+" side of the error amplifier 24 is connected to the output terminal of the reference power supply 23, and an input terminal of "−" side is connected to the connection point between the antenna coil 13 and the monitor resistor 21. An output terminal of the error amplifier 24 is connected to an input terminal of the changeover switch 25. The error amplifier 24 amplifies a difference between the monitor voltage Vm and the reference voltage Vref (160 mV), and outputs the amplified signal (control voltage Ve) to the changeover switch 25.

A control terminal of "+" side of the changeover switch 25 is connected to an output terminal of the comparator 22, and a control terminal of "−" side is grounded. Also, an output terminal of the changeover switch 25 is connected to the terminal of the parallel variable capacitor 14 of the DC-removal capacitor 16 side through a resistor 6.

The ON/OFF of the changeover switch 25 is controlled by the output signal of the comparator 22. Specifically, in a case where the monitor voltage Vm is higher than the reference voltage Vref (160 mV) (a case where the communication state is the communication state of the region B), the changeover switch 25 is controlled to an OFF state by the output signal of the comparator 22. On the other hand, in a case where the monitor voltage Vm is equal to or lower than the reference voltage Vref (160 mV) (a case where the communication state is the communication state of the region C), the changeover switch 25 is controlled to an ON state by the output signal of the comparator 22.

That is, in the present embodiment, in a case where the communication state is the communication state of the region C in FIG. 8 (a case where the influence of the mutual inductance M is great), the resonance characteristic of the transmission antenna 3 is corrected by applying the output voltage (Ve) of the error amplifier 24 to the parallel variable capacitor 14 in a feedback manner. On the other hand, in a case where the communication state is the communication state of the region B in FIG. 8 (a case where the influence of the mutual inductance M is small), in the present embodiment, the output voltage (Ve) of the error amplifier 24 is not fed back to the parallel variable capacitor 14, and the resonance characteristic of the transmission antenna 3 is not corrected.

The resistor 6 is provided between the output terminal of the changeover switch 25 of the correction circuit unit 5 and the terminal of the parallel variable capacitor 14 of the DC-removal capacitor 16 side within the transmission antenna 3. Also, the resistor 7 is provided between the terminal of the parallel variable capacitor 14 of the DC-removal capacitor 17 side within the transmission antenna 3 and the ground. The resistors 6 and 7 are resistors provided for limiting the bias current and suppressing signal interference between the correction circuit unit 5 and the transmission antenna 3 (resonant circuit) (for separating the two sides). Thus, the resistors 6 and 7 are configured by resistive elements each having a high resistance of, for example, 100 kΩ or the like.

Also, the monitor circuit unit 4 and the correction circuit unit 5 described above are mounted as a single LSI (integrated circuit) in an actual circuit. Also, since the signal source 11 is mounted as the LSI in the actual circuit as described above, the signal output unit 2, the monitor circuit unit 4, and the correction circuit unit 5 may be mounted on a single LSI in the R/W device 1 of the present embodiment.

(2) Operation of R/W Device

Figure 12:
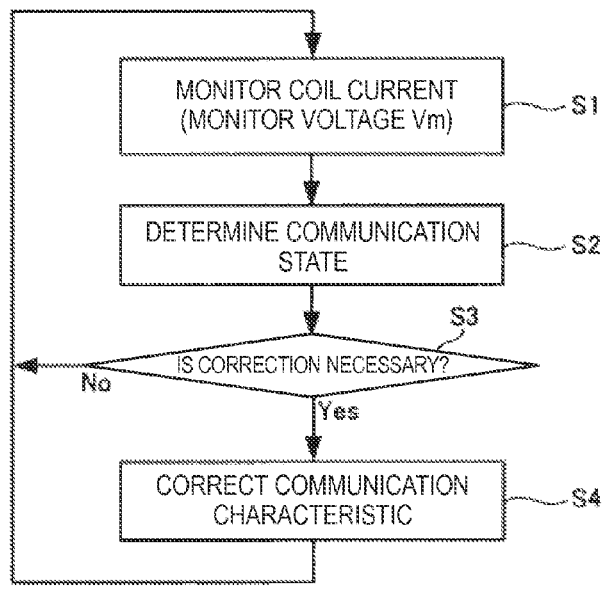
FIG. 12 is a flowchart illustrating procedures of a communication state monitoring method and a communication characteristic correcting method of the R/W device according to the first embodiment.

Next, the communication state monitoring operation and the communication characteristic correcting operation of the R/W device 1 of the present embodiment will be described below with reference to FIG. 12. Incidentally, FIG. 12 is a flowchart illustrating procedures of the communication state monitoring operation and the communication characteristic correcting operation of the R/W device 1.

First, after starting the R/W device 1, the monitor circuit unit 4 monitors the coil current flowing through the transmission antenna 3 (step S1). Specifically, the monitor circuit unit 4 detects the monitor voltage Vm corresponding to the coil current (voltage between the terminals of the monitor resistor 21).

Subsequently, the monitor circuit unit 4 determines the current communication state (step S2). Specifically, the monitor circuit unit 4 compares the monitor voltage Vm detected in step S1 with the reference voltage Vref (160 mV) by the comparator 22, and determines whether the communication state is the state of, for example, the region B or the region C in FIG. 8, based on the comparison result.

Subsequently, the monitor circuit unit 4 determines whether it is necessary to correct the communication characteristic, based on the comparison result of step S3 between the monitor voltage Vm and the reference voltage Vref (160 mV) (step S3).

Also, as described in FIG. 8, in a case (region B) where the monitor voltage Vm is higher than the reference voltage Vref (160 mV), the distance d between the R/W device and the non-contact IC card is large to some extent, and the influence of the mutual inductance M is small. Therefore, a good communication state is obtained. On the other hand, in a case (region C) where the monitor voltage Vm is equal to or lower than the reference voltage Vref (160 mV), the distance d between the R/W device and the non-contact IC card is small, and the influence of the mutual inductance M is great. Therefore, the communication state is degraded.

Thus, in a case where the monitor voltage Vm is higher than the reference voltage Vref (160 mV), the communication state is a good state, and it is unnecessary to correct the communication characteristic. Therefore, step S3 is determined as No. In this case, the operation is returned to step S1, and the operations of steps S1 and S2 are repeated. Specifically, the R/W device 1 sets the changeover switch 25 of the correction circuit unit 5 to an OFF state by the output signal of the comparator 22, does not apply the control voltage Ve to the parallel variable capacitor 14, and does not correct the resonance characteristic of the transmission antenna 3.

On the other hand, in a case where the monitor voltage Vm is equal to or lower than the reference voltage Vref (160 mV), it is unnecessary to correct the communication characteristic, and therefore, step S3 is determined as Yes. Thus, in this case, the R/W device 1 corrects the communication characteristic (step S4). Specifically, the R/W device 1 sets the changeover switch 25 of the correction circuit unit 5 to an ON state by the output signal of the comparator 22, applies the control voltage Ve to the parallel variable capacitor 14, and corrects the resonance characteristic of the transmission antenna 3. Also, in this case, in the present embodiment, since it is determined that the resonance frequency of the R/W device 1 has been lowered by the influence of the antenna coil of the non-contact IC card, control is performed such that the resonance frequency is increased by lowering the capacitance C1 of the parallel variable capacitor 14.

After correcting the resonance characteristic of the transmission antenna 3, the R/W device 1 returns to the operation of step S1, and repeats the operations of steps S1 to S4. In the present embodiment, in this way, the communication state of the R/W device 1 is monitored and determined, and the communication characteristic is appropriately corrected based on the result.

Also, in the present embodiment, the range of the monitor voltage Vm equal to or lower than the reference voltage Vref has been set as the correction (control) range, but this is because the communication state may not converge to the optimum state when automatic control is performed in all communication states, including a communication state in which a signal-to-noise ratio is low. However, the problem of the case where the automatic control is performed in all the communication states can be solved by providing a hysteresis to the comparator 22 to prevent the changeover switch 25 from repeating the ON/OFF operations at around the reference voltage Vref (160 mV).

[Second Embodiment]

In the first embodiment, the example of correcting the resonance characteristic of the transmission antenna 3 by changing the capacitance C1 of the parallel variable capacitor 14 has been described, but the present disclosure is not limited thereto. It may be configured such that two parallel capacitors are prepared in the transmission antenna, and the parallel capacitor to be used is switched according to the communication state. In the second embodiment, the configuration example thereof will be described below. Also, in the present embodiment, as in the first embodiment, the configuration example of determining whether the communication state is the state of the region B or the region C in FIG. 8 and correcting the resonance frequency deviation by changing the resonance characteristic of the transmission antenna (resonant circuit), based on the determination result will be described below.

(1) Configuration of R/W Device

Figure 13:
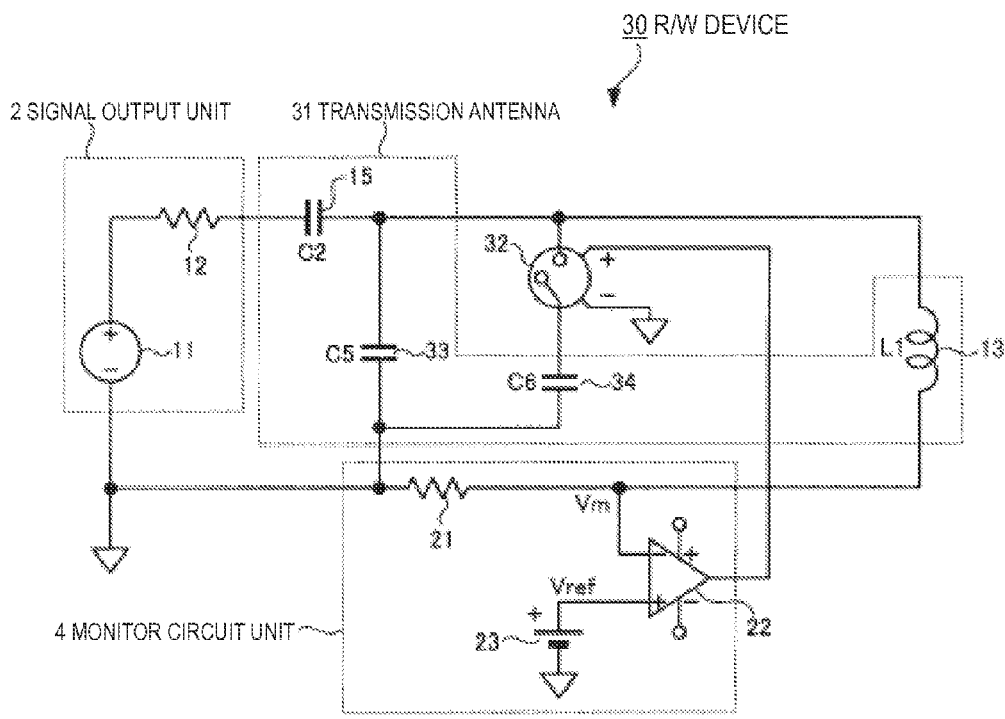
FIG. 13 is a circuit configuration diagram of an R/W device according to a second embodiment.

FIG. 13 illustrates a circuit configuration of an R/W device according to a second embodiment. Also, in the R/W device 30 of the present embodiment, which is illustrated in FIG. 13, the same elements as those of the R/W device 1 of the first embodiment, which is illustrated in FIG. 11, are assigned with the same reference numerals.

The R/W device 30 (transmission device) includes a signal output unit 2, a transmission antenna 31 (transmission unit), a monitor circuit unit 4 (communication monitor unit), and a changeover switch 32 (communication correction unit). Also, the monitor circuit unit 4 and the changeover switch 32 are mounted on a single LSI (integrated circuit) in an actual circuit. Also, since the signal output unit 2 and the monitor circuit unit 4 of the present embodiment are the same configuration as the corresponding parts of the first embodiment, a description of such a configuration will be omitted herein.

The transmission antenna 31 is configured by an antenna coil 13, a first parallel capacitor 33, a second parallel capacitor 34, and a series capacitor 15. Also, the antenna coil 13 and the series capacitor 15 of the present embodiment are the same configuration as the corresponding circuit elements of the first embodiment.

In the present embodiment, a terminal of one side of the first parallel capacitor 33 is connected to a terminal of one side of the antenna coil 13 and a terminal of the series capacitor 15 on an opposite side to the output impedance 12, and a terminal of the other side of the first parallel capacitor 33 is grounded. Also, a terminal of one side of the second parallel capacitor 34 is connected to a terminal of one side of the antenna coil 13 through the changeover switch 32, and a terminal of the other side of the second parallel capacitor 34 is grounded. Also, a terminal of the other side of the antenna coil 13 is grounded through a monitor resistor 21 of the monitor circuit unit 4. That is, in the present embodiment, a series circuit, which is configured by the first parallel capacitor 33, the second parallel capacitor 34, and the changeover switch 32, and a series circuit, which is configured by the antenna coil 13 and the monitor resistor 21, are connected in parallel to each other.

A control terminal of "+" side of the changeover switch 32 is connected to an output terminal of a comparator 22, and a control terminal of "−" side is grounded. Also, a terminal of one side of the changeover switch 32 is connected to the terminal of one side of the antenna coil 13 and the terminal of one side of the first parallel capacitor 33, and a terminal of the other side of the changeover switch 32 is connected to the terminal of one side of the second parallel capacitor 34.

The ON/OFF of the changeover switch 32 is controlled by the output signal of the comparator 22. Specifically, in a case where the monitor voltage Vm is higher than the reference voltage Vref (160 mV) (a case where the communication state is the communication state of the region B), the changeover switch 32 is controlled to an ON state by the output signal of the comparator 22. On the other hand, in a case where the monitor voltage Vm is equal to or lower than the reference voltage Vref (160 mV) (a case where the communication state is the communication state of the region C), the changeover switch 32 is controlled to an OFF state by the output signal of the comparator 22.

That is, in the present embodiment, in a case where the communication state is the communication state of the region C in FIG. 8 (a case where the influence of the mutual inductance M is great), the resonance characteristic (transmission characteristic) of the transmission antenna 31 is corrected by disconnecting the second parallel capacitor 34 from the transmission antenna 31. On the other hand, in a case where the communication state is the communication state of the region B in FIG. 8 (a case where the influence of the mutual inductance M is small), the resonance characteristic of the transmission antenna 31 is not corrected by maintaining the state in which the second parallel capacitor 34 is connected to the transmission antenna 31.

Thus, in the present embodiment, in a case where the communication state is a good state, the constants (L1, C2, C5 and C6) of the respective circuit elements of the transmission antenna 3 are appropriately set such that impedance matching is achieved between the signal output unit 2 and the transmission antenna 31. Also, in the present embodiment, at the time of correcting the communication state (when disconnecting the second parallel capacitor 34), the capacitances (C5 and C6) of the respective parallel capacitors are set such that the communication state is corrected from the communication state of the region C of FIG. 8 to the communication state of the region B of FIG. 8.

(2) Operation of R/W Device

Next, the communication state monitoring operation and the communication characteristic correcting operation of the R/W device 30 of the present embodiment will be described below. The communication state monitoring operation and the communication characteristic correcting operation according to the present embodiment are performed by the same procedures as those of the first embodiment (FIG. 12). Specifically, the operation of monitoring the coil current flowing through the transmission antenna 3 (monitor voltage Vm) (step S1), the operation of determining the communication state (step S2), the operation of determining whether to correct the communication characteristic (step S3), and the operation of correcting the communication characteristic (step S4) are repeated in this order.

However, when it is determined in step S3 that it is necessary to correct the communication characteristic, the R/W device 30 of the present embodiment corrects the resonance characteristic of the transmission antenna 31, in step S4, by disconnecting the second parallel capacitor 34 from the transmission antenna 31 by the changeover switch 32.

As described above, even in the present embodiment, as in the first embodiment, the R/W device 30 can determine the communication state and can correct the communication state to the good state based on the determination result. Also, as in the first embodiment, the R/W device 30 of the present embodiment cannot continuously correct the resonance characteristic of the transmission antenna, but the circuit configuration is simpler than that of the first embodiment. Also, since the present embodiment is configured to switch the two parallel capacitors, there occurs no problem that the communication state does not converge to the optimum state, which has been described in the first embodiment.

However, in the configuration of the present embodiment, an expensive switch having an excellent high-frequency characteristic and high voltage resistance performance is required as the changeover switch 32. Thus, in terms of costs, the configuration of the first embodiment is more advantageous than that of the present embodiment.

[Third Embodiment]

In the second embodiment, the example of correcting the resonance characteristic of the transmission antenna by switching two parallel capacitors has been described, but the present disclosure is not limited thereto. It may be configured such that two antenna coils are prepared in the transmission antenna, and the antenna coil to be used is switched according to the communication state. In the third embodiment, the configuration example thereof will be described below. Also, in the present embodiment, as in the first embodiment, the configuration example of determining whether the communication state is the state of the region B or the region C in FIG. 8 and correcting the resonance frequency deviation by changing the resonance characteristic (communication characteristic) of the transmission antenna, based on the determination result, will be described below.

(1) Configuration of R/W Device

Figure 14:
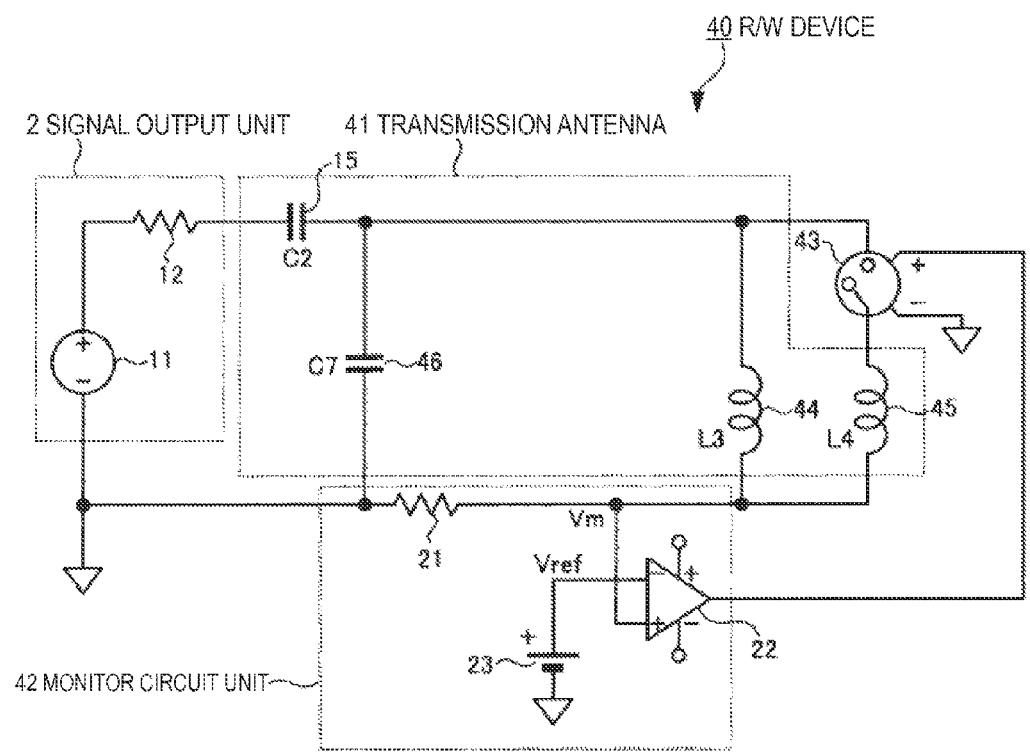
FIG. 14 is a circuit configuration diagram of an R/W device according to a third embodiment.

FIG. 14 illustrates a circuit configuration of an R/W device according to a third embodiment. Also, in the R/W device 40 of the present embodiment, which is illustrated in FIG. 14, the same elements as those of the R/W device 1 of the first embodiment, which is illustrated in FIG. 11, are assigned with the same reference numerals.

The R/W device 40 (transmission device) includes a signal output unit 2, a transmission antenna 41 (transmission unit), a monitor circuit unit 42 (communication monitor unit), and a changeover switch 43 (communication correction unit). Also, the monitor circuit unit 42 and the changeover switch 43 are mounted on a single LSI (integrated circuit) in an actual circuit. Also, since the signal output unit 2 of the present embodiment is the same configuration as that of the first embodiment, a description of the signal output unit 2 will be omitted herein.

The transmission antenna 41 is configured by a first antenna coil 44, a second antenna coil 45, a parallel capacitor 46, and a series capacitor 15. Also, the series capacitor 15 in the present embodiment is the same configuration as that of the first embodiment. Also, in the present embodiment, the size of each of the antenna coils is set to a small size.

In the present embodiment, a terminal of one side of the first antenna coil 44 is connected to a terminal of one side of the parallel capacitor 46 and a terminal of the series capacitor 15 on an opposite side to output impedance 12. Also, a terminal of the other side of the first antenna coil 44 is grounded through a monitor resistor 21 of the monitor circuit unit 42.

A terminal of one side of the second antenna coil 45 is connected to the terminal of one side of the first antenna coil 44 through the changeover switch 43, and a terminal of the other side of the second antenna coil 45 is connected to the terminal of the other side of the first antenna coil 44. Also, a terminal of the other side of the parallel capacitor 46 is grounded. That is, in the present embodiment, the first antenna coil 44 is connected in parallel to the series circuit configured by the second antenna coil 45 and the changeover switch 43. Also, That is, in the present embodiment, the series circuit configured by a circuit group, which includes the first antenna coil 44 and the second antenna coil 45, and the monitor resistor 21 is connected in parallel to the parallel capacitor 46.

The monitor circuit unit 42 is a circuit that monitors the coil current flowing through the antenna coil. The monitor circuit unit 42 includes the monitor resistor 21, a comparator 22, and a reference power supply 23. In the present embodiment, due to the monitor resistor 21, the coil current flowing through the antenna coil is converted into the voltage (monitor voltage Vm), and the communication state is determined based on the converted monitor voltage Vm.

Also, the respective elements of the monitor circuit unit 42 are the same configuration as those of the first embodiment. However, in the present embodiment, a connection point between the first antenna coil 44 and the monitor resistor 21 is connected to an input terminal of "+" side of the comparator 22, and an output terminal of the reference power supply 23 is connected to an input terminal of "−" side of the comparator 22. In the monitor circuit unit 42 of the present embodiment, the configuration other than the connection form of the two input terminals of the comparator 22 is the same as that of the monitor circuit unit 4 of the first embodiment. Also, in the present embodiment, since the size of the antenna coil is set to the small size and it is determined whether the communication state is the state of the region B or the region C in FIG. 8, the reference voltage Vref is 160 mV (see FIG. 8).

A control terminal of "+" side of the changeover switch 43 is connected to an output terminal of the comparator 22, and a control terminal of "−" side is grounded. Also, a terminal of one side of the changeover switch 43 is connected to the terminal of one side of the first antenna coil 44 and the terminal of one side of the parallel capacitor 46, and a terminal of the other side of the changeover switch 43 is connected to the terminal of one side of the second antenna coil 45.

The ON/OFF of the changeover switch 43 is controlled by the output signal of the comparator 22. Specifically, in a case where the monitor voltage Vm is higher than the reference voltage Vref (160 mV) (a case where the communication state is the communication state of the region B), the changeover switch 43 is controlled to an OFF state by the output signal of the comparator 22. On the other hand, in a case where the monitor voltage Vm is equal to or lower than the reference voltage Vref (160 mV) (a case where the communication state is the communication state of the region C), the changeover switch 43 is controlled to an ON state by the output signal of the comparator 22.

That is, in the present embodiment, in a case where the communication state is the communication state of the region C in FIG. 8 (a case where the influence of the mutual inductance M is great), the resonance characteristic of the transmission antenna 41 is corrected (resonance frequency is increased) by connecting the second antenna coil 45 to the transmission antenna 41. On the other hand, in a case where the communication state is the communication state of the region B in FIG. 8 (a case where the influence of the mutual inductance M is small), the resonance characteristic of the transmission antenna 41 is not corrected by maintaining the state in which the second antenna coil 45 is disconnected from the transmission antenna 41.

Thus, in the present embodiment, in a case where the communication state is a good state, the constants (C2, C7 and L3) of the two capacitors and the first antenna coil 44 are appropriately set such that impedance matching is achieved between the signal output unit 2 and the transmission antenna 41. Also, in the present embodiment, at the time of correcting the communication state (when connecting the second antenna coil 45), the inductances (L3 and L4) of the respective antenna coils are set such that the communication state is corrected from the communication state of the region C of FIG. 8 to the communication state of the region B of FIG. 8.

(2) Operation of R/W Device

Next, the communication state monitoring operation and the communication characteristic correcting operation of the R/W device 40 of the present embodiment will be described below. The communication state monitoring operation and the communication characteristic correcting operation according to the present embodiment are performed by the same procedures as those of the first embodiment (FIG. 12). Specifically, the operation of monitoring the coil current flowing through the transmission antenna 41 (monitor voltage Vm) (step S1), the operation of determining the communication state (step S2), the operation of determining whether to correct the communication characteristic (step S3), and the operation of correcting the communication characteristic (step S4) are repeated in this order.

However, when it is determined in step S3 that it is necessary to correct the communication characteristic, the R/W device 40 of the present embodiment corrects the resonance characteristic (communication characteristic) of the transmission antenna 41, in step S4, by connecting the second antenna coil 45 to the transmission antenna 41 by the changeover switch 43.

As described above, even in the present embodiment, as in the first embodiment, the R/W device 40 can determine the communication state and can correct the communication state to the good state based on the determination result.

Also, in a case where there is the influence of the magnetic coupling between the R/W device 40 and the non-contact IC card, there is a problem that the inductance of the antenna coil is changed. Thus, the method of directly correcting the inductance of the antenna coil as in the present embodiment can accurately correct the resonance characteristic and ensure more stable communication. Also, since the present embodiment is configured to switch the two antenna coils, the circuit configuration is simplified and there occurs no problem that the communication state does not converge to the optimum state, which has been described in the first embodiment.

However, even in the present embodiment, as in the second embodiment, an expensive switch having an excellent high-frequency characteristic and high voltage resistance performance is required as the changeover switch 43. Thus, in terms of costs, the configuration of the first embodiment is more advantageous than that of the present embodiment. Also, in the present embodiment, since the two antenna coils are used, the transmission antenna 41 needs to be configured by using smaller antenna coils. Thus, in the configuration of the present embodiment, it is likely that limitations will be caused to the size or arrangement of the antenna coils as compared with the configuration of the first embodiment.

[Fourth Embodiment]

In the fourth embodiment, an example of an R/W device that determines a communication state by using the above-described communication state monitoring method and corrects a resonance frequency deviation caused by temporal change of circuit elements constituting a transmission antenna, based on the determination result, will be described below.

The proposers of the present disclosed technology suggested, in Japanese Patent Application No. 2009-230093 filed earlier, an R/W device that receives a signal output from a transmission antenna through its own reception antenna, and corrects a resonance frequency deviation by optimizing a phase difference between a transmission signal and a reception signal.

In this technology, by installing a phase difference adjustment mode function on the R/W device, the resonance frequency deviation can be corrected even at the time other than shipping adjustment (for example, at midnight or the like) by periodically executing an adjustment mode. By executing such an adjustment mode, it is possible to correct the temporal change or the like of the resonance frequency and obtain a more stable communication characteristic. However, since this technology is executed in the adjustment mode only when satisfying a predetermined condition, there is a possibility that the processing will be complicated. Also, in this technology, it is necessary to temporarily interrupt the communication operation during the execution of the adjustment mode.

However, in the case of using the above-described communication state monitoring method of the present disclosure, the resonance frequency deviation (temporal change of the resonance frequency) can be corrected without providing the phase difference adjustment mode to the R/W device and interrupting the communication at the time of correcting the resonance frequency.

In the communication state monitoring method of the present disclosure, as described above, whether the non-contact IC card exists within the communicable range of the R/W device can be determined by determining whether the monitor voltage Vm is a value around the maximum value. Therefore, in the present embodiment, the resonance frequency deviation is corrected by determining whether the non-contact IC card exists within the communicable range of the R/W device by using the communication state monitoring method of the present disclosure, and performing the phase difference adjustment of the transmission signal when the non-contact IC card does not exist.

(1) Configuration of R/W Device

Figure 15:
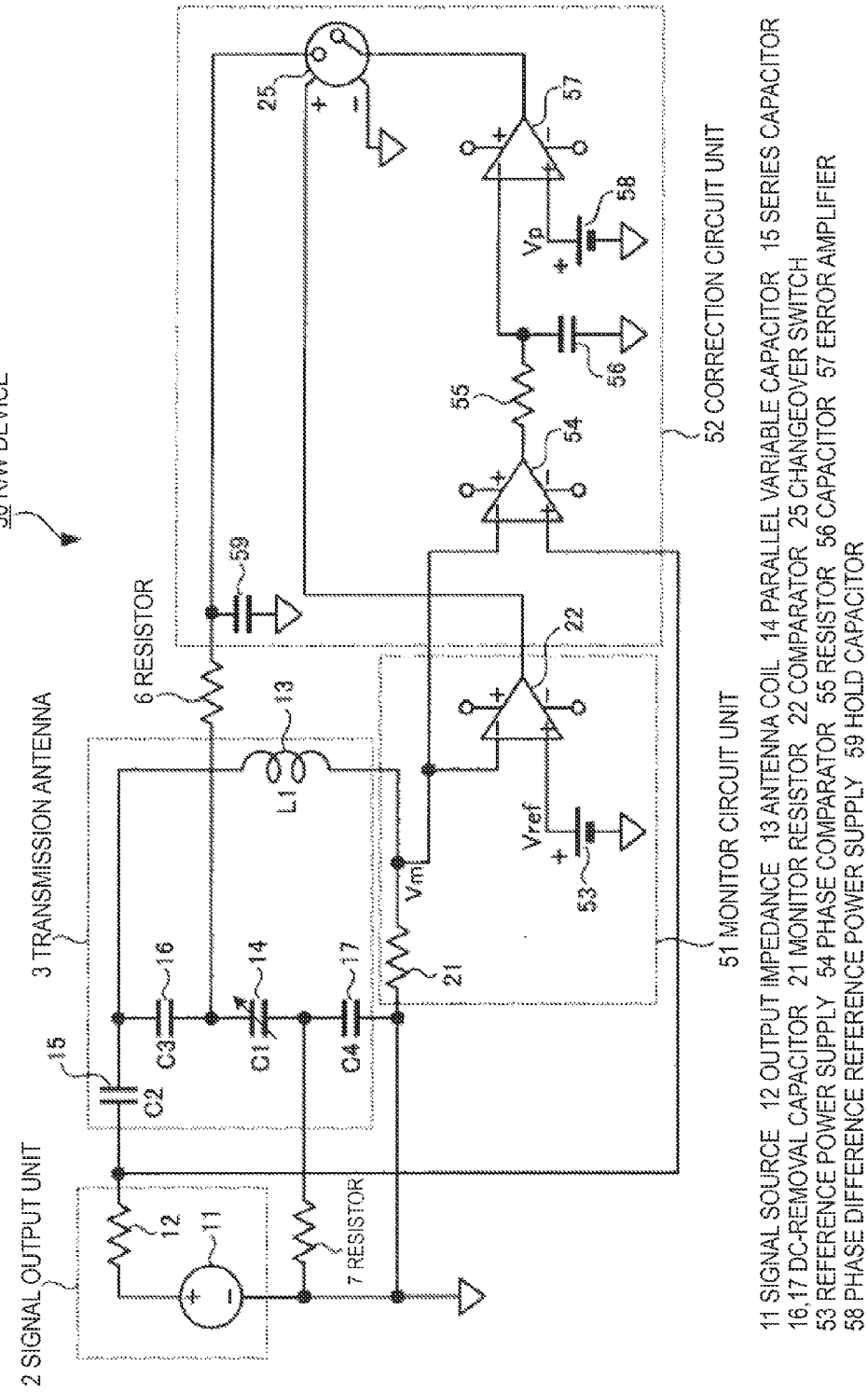
FIG. 15 is a circuit configuration diagram of an R/W device according to a fourth embodiment.

FIG. 15 illustrates a circuit configuration of an R/W device according to a fourth embodiment. Also, in the R/W device 50 of the present embodiment, which is illustrated in FIG. 15, the same elements as those of the R/W device 1 of the first embodiment, which is illustrated in FIG. 11, are assigned with the same reference numerals.

The R/W device 50 (transmission device) includes a signal output unit 2, a transmission antenna 3 (transmission unit), a monitor circuit unit 51 (communication monitor unit), a correction circuit unit 52 (communication correction unit), and two resistors 6 and 7. Also, the monitor circuit unit 51 and the correction circuit unit 52 are mounted on a single LSI (integrated circuit) in an actual circuit. Also, since the signal output unit 2, the transmission antenna 3, and two resistors 6 and 7 of the present embodiment are the same configuration as the corresponding parts of the first embodiment, a description of such a configuration will be omitted herein.

The monitor circuit unit 51 is a circuit that monitors the coil current flowing through the antenna coil 13. The monitor circuit unit 51 includes a monitor resistor 21, a comparator 22, and a reference power supply 53. Also, the connection relationship of the respective elements of the monitor circuit unit 51 is the same as that of the first embodiment. Also, in the present embodiment, due to the monitor resistor 21, the coil current flowing through the antenna coil 13 is converted into the voltage (monitor voltage Vm), and the communication state is determined based on the converted monitor voltage Vm.

In the present embodiment, since whether the non-contact IC card exists within the communicable range of the R/W device is determined as described above, the reference voltage Vref is set to a value around the maximum value of the monitor voltage Vm. In the present embodiment, since the size of the antenna coil is set to the small size, the maximum value of the monitor voltage Vm is about 300 mV. Therefore, in the present embodiment, a threshold voltage (Vref) for determining whether the non-contact IC card exists within the communicable range of the R/W device is set to a value slightly smaller than the maximum value of the monitor voltage Vm, specifically, 290 mV, which is 3% smaller than the maximum value. That is, the output voltage of the reference power supply 53 is set to 290 mV. Also, in the present embodiment, the threshold voltage (Vref) used to determine the communication state is not limited to 290 mV and can be appropriately changed according to conditions, for example, purposes or the like.

The correction circuit unit 52 includes a phase comparator 54, a resistor 55, a capacitor 56, an error amplifier 57, a phase difference reference power supply 58, a changeover switch 25, and a hold capacitor 59. Also, since the changeover switch 25 of the present embodiment is the same configuration as that of the first embodiment, a description of the changeover switch 25 will be omitted herein.

An input terminal of "−" side of the phase comparator 54 is connected to a connection point between the antenna coil 13 and the monitor resistor 21, and an input terminal of "+" side of the phase comparator 54 is connected to an output terminal of the signal output unit 2. Also, an output terminal of the phase comparator 54 is connected to a terminal of one side of the resistor 55.

The phase comparator 54 compares a phase of a signal output from the signal output unit 2 (hereinafter, referred to as a signal source phase) with a phase of a transmission signal transmitted from the transmission antenna 3 (hereinafter, referred to as a monitor phase), and outputs a voltage signal corresponding to a phase difference of the two sides to the resistor 55.

A terminal of the other side of the resistor 55 is connected to a terminal of one side of the capacitor 56 and an input terminal of "−" side of the error amplifier 57. Also, a terminal of the other side of the capacitor 56 is grounded. That is, in the present embodiment, an RC filter is configured by the resistor 55 and the capacitor 56. The RC filter converts a signal output from the phase comparator 54 into a series voltage, and applies the converted series voltage to the input voltage of the "−" side of the error amplifier 57. Also, the resistor 55 can be configured by, for example, a resistive element having a resistance of 100 kΩ, and the capacitor 56 can be configured by, for example, a capacitive element having a capacitance of 1 nF.

An input terminal of "+" side of the error amplifier 57 is connected to the output terminal of the phase difference reference power supply 58, and an input terminal of "−" side is connected to the connection point between the resistor 55 and the capacitor 56 (output terminal of the RC filter). An output terminal of the error amplifier 57 is connected to an input terminal of the changeover switch 25. Also, an output voltage Vp of the phase difference reference power supply 58 outputs a voltage corresponding to an optimum phase difference (hereinafter, referred to as a phase difference reference voltage Vp). Also, the phase difference reference voltage Vp, for example, is appropriately set in advance, considering conditions such as a type or purpose of the device. The error amplifier 57 amplifies a difference between the DC voltage, which corresponds to the phase difference between the signal source phase and the monitor phase, and the phase difference reference voltage Vp, and outputs the amplified voltage to the changeover switch 25.

A terminal of one side of the hold capacitor 59 is connected to an output terminal of the changeover switch 25 and a terminal of one side of the resistor 6, and a terminal of the other side of the hold capacitor 59 is grounded. The hold capacitor 59 is a capacitor that is provided for holding the control voltage applied to the parallel variable capacitor 14 when the phase difference adjustment is not performed (the changeover switch 25 is in an OFF state). The hold capacitor 59 can be configured by, for example, a capacitor having a capacitance of 10 nF.

Also, in the present embodiment, the phase difference adjustment is performed in a case where the monitor voltage Vm is within a range of 290 mV to 300 mV (a case where the non-contact IC card does not exist within the communicable range of the R/W device, or in a case where the non-contact IC card exists but the influence thereof is negligible). In particular, in this case, the changeover switch 25 is set to an ON state by the comparator 22, and therefore, the resonance frequency deviation is corrected by correcting the phase difference (communication characteristic). On the other hand, in a case where the monitor voltage Vm is lower than the reference voltage Vref (290 mV) (a case where the non-contact IC card exists within the communicable range of the R/W device), the changeover switch 25 is maintained in an OFF state by the comparator 22, and the phase difference adjustment is not performed.

(2) Operation of R/W Device

Next, the communication state monitoring operation and the communication characteristic correcting operation of the R/W device 50 of the present embodiment will be described below. The communication state monitoring operation and the communication characteristic correcting operation according to the present embodiment are performed by the same procedures as those of the first embodiment (FIG. 12). Specifically, the operation of monitoring the coil current flowing through the transmission antenna 3 (monitor voltage Vm) (step S1), the operation of determining the communication state (step S2), the operation of determining whether to correct the communication characteristic (step S3), and the operation of correcting the communication characteristic (step S4) are repeated in this order.

However, in the present embodiment, in step S3, whether the non-contact IC card exits within the communicable range of the R/W device is determined by comparing the monitor voltage Vm with the threshold voltage (Vref=290 mV).

When it is determined in step S3 that the non-contact IC card does not exist within the communicable range of the R/W device (when monitor voltage Vm=290 mV to 300 mV), step S3 is determined as Yes. In this case, in step S4, the correction circuit unit 52 sets the changeover switch 25 to an ON state, performs the phase difference adjustment of the transmission signal, and corrects the resonance frequency deviation. Specifically, a difference voltage between the voltage, which corresponds to the phase difference between the signal source phase and the monitor phase, and the phase difference reference voltage Vp is applied to the parallel variable capacitor 14 as the control voltage, and the phase difference adjustment of the transmission signal is performed. Also, at this time, the hold capacitor 59 is also charged.

On the other hand, when it is determined in step S3 that the non-contact IC card exists within the communicable range of the R/W device (when monitor voltage Vm<290 mV), step S3 is determined as No. In this case, in step S4, the correction circuit unit 52 sets the changeover switch 25 to an OFF state. However, in this case, the voltage held in the hold capacitor 59 is applied to the parallel variable capacitor 14 as the control voltage. Also, at this time, since no current flows through the capacitor, the control voltage applied to the parallel variable capacitor 14 is not almost changed within the period of about the communication time, and the problem of the resonance frequency deviation does not occur.

In the present embodiment, as described above, the resonance frequency deviation of the transmission antenna 3 is adjusted, and the temporal change or the like of the resonance frequency is corrected. Also, in the present embodiment, the example of correcting the phase difference (communication characteristic) only when the monitor voltage Vm is within a range of the reference voltage Vref (290 mV) to the maximum value (300 mV) has been described, but the present disclosure is not limited thereto. It is possible to always perform the phase difference adjustment by setting the changeover switch 25 to an ON state. However, as in the present embodiment, for example, the increase in power consumption or the generation of noise, which are caused by unnecessary phase difference adjustment operations, can be avoided by performing a phase difference adjustment limited to a predetermined voltage range.

[Fifth Embodiment]

In the first to third embodiments, the example of correcting the resonance characteristic (resonance frequency) of the transmission antenna of the R/W device in a case where the communication state is the state of the region C in FIG. 8 (a case where the influence of the mutual inductance M is great) has been described, but the present disclosure is not limited thereto. The reason why the detection voltage Vov on the non-contact IC card side is reduced when the communication state is the state of the region C in FIG. 8 is because the impedance of the transmission antenna, when seen from the signal source of the R/W device, is deviated from a predetermined value by the magnetic coupling between the antennas, and the transmission output is reduced.

Thus, the most reliable method for increasing the detection voltage Vov on the non-contact IC card side is to increase the transmission output of the R/W device. A method for increasing the transmission output, for example, can use the following three methods.

(a) To increase transmission voltage
(b) To increase transmission current (current flowing through transmission antenna)
(c) To increase coil current (current flowing through antenna coil)

In the fifth embodiment, the configuration example of the R/W device using the method (method (b)) for increasing the transmission current will be described below. Also, in the present embodiment, as in the first embodiment, an example of determining whether the communication state is the state of the region B or the region C in FIG. 8 and correcting the communication state by changing the output characteristic (communication characteristic) of the R/W device, based on the determination result, will be described below.

(1) Configuration of R/W Device

Figure 16:
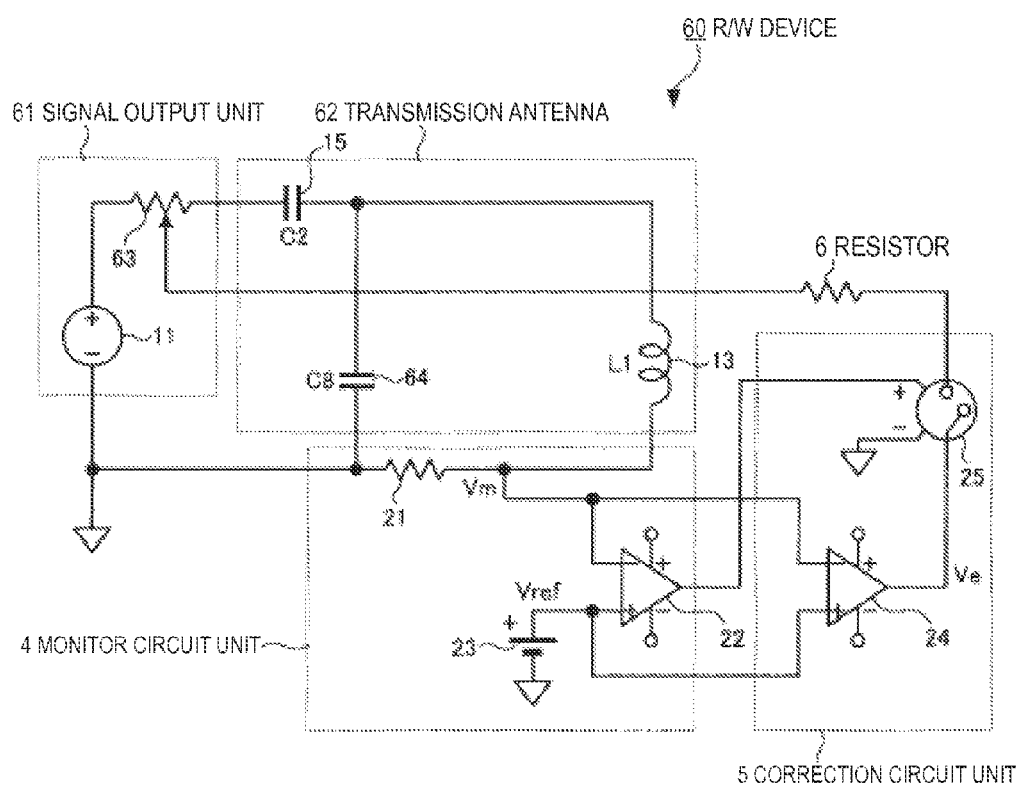
FIG. 16 is a circuit configuration diagram of an R/W device according to a fifth embodiment.

FIG. 16 illustrates a circuit configuration of an R/W device according to a fifth embodiment. Also, in the R/W device 60 of the present embodiment, which is illustrated in FIG. 16, the same elements as those of the R/W device 1 of the first embodiment, which is illustrated in FIG. 11, are assigned with the same reference numerals.

The R/W device 60 (transmission device) includes a signal output unit 61, a transmission antenna 62 (transmission unit), a monitor circuit unit 4 (communication monitor unit), a correction circuit unit 5 (communication correction unit), and a resistor 6. Also, the monitor circuit unit 4 and the correction circuit unit 5 are mounted on a single LSI (integrated circuit) in an actual circuit. Also, since the monitor circuit unit 4, the correction circuit unit 5, and the resistor 6 of the present embodiment are the same configuration as the corresponding parts of the first embodiment, a description of such a configuration will be omitted herein.

The signal output unit 61 is configured by a signal source 11 that outputs a signal of a predetermined frequency (13.56 MHz), and variable output impedance 63 that has variable impedance. Also, the signal source 11 can have the same configuration as that of the first embodiment.

The variable output impedance 63 is connected to an output terminal of the correction circuit unit 5 (changeover switch 25) through the resistor 6. The impedance of the variable output impedance 63 is changed based on a signal that is input from the correction circuit unit 5 through the resistor 6.

The transmission antenna 62 is configured by an antenna coil 13, a parallel capacitor 64, and a series capacitor 15. In the present embodiment, a terminal of one side of the first antenna coil 13 is connected to a terminal of one side of the parallel capacitor 64 and a terminal of the series capacitor 15 on an opposite side to the variable output impedance 63. Also, a terminal of the other side of the antenna coil 13 is grounded through a monitor resistor 21 of the monitor circuit unit 4. Also, a terminal of the other side of the parallel capacitor 64 is grounded. That is, in the present embodiment, the parallel capacitor 64 is connected in parallel to the series circuit configured by the antenna coil 13 and the monitor resistor 21.

Also, in the present embodiment, since the size of the antenna coil 13 is set to the small size and it is determined whether the communication state is the state of the region B or the region C in FIG. 8, a reference voltage Vref used in the monitor circuit unit 4 is 160 mV (see FIG. 8). Thus, in the present embodiment, in a case where the communication state is a good state, the constants (inductance and capacitance) of the respective circuit elements of the transmission antenna 62 are appropriately set such that impedance matching is achieved with 50 Ω between the signal output unit 61 and the transmission antenna 62.

In the R/W device 60 of the present embodiment, in a case where the monitor voltage Vm is equal to or lower than the reference voltage Vref (160 mV) (a case where the communication state is the communication state of the region C in FIG. 8), the changeover switch 25 is controlled to an ON state by the output signal of the comparator 22. Therefore, the impedance of the variable output impedance 63 is changed by applying an output voltage Ve of the correction circuit unit 5 to the variable output impedance 63 (by feedback control). At this time, in the present embodiment, since the transmission output is determined as deficient, the transmission current is increased by reducing the impedance of the variable output impedance 63. As a result, the transmission output (transmission power) of the R/W device 60 is increased, and the detection voltage Vov on the non-contact IC card side is also increased.

On the other hand, in a case where the monitor voltage Vm is higher than the reference voltage Vref (160 mV) (a case where the communication state is the communication state of the region B in FIG. 8), the R/W device 60 performs control such that the changeover switch 25 becomes an OFF state, and does not change the impedance of the variable output impedance 63.

(2) Operation of R/W Device

Next, the communication state monitoring operation and the communication characteristic correcting operation of the R/W device 60 of the present embodiment will be described below. The communication state monitoring operation and the communication characteristic correcting operation according to the present embodiment are performed by the same procedures as those of the first embodiment (FIG. 12). Specifically, the operation of monitoring the coil current flowing through the transmission antenna 62 (monitor voltage Vm) (step S1), the operation of determining the communication state (step S2), the operation of determining whether to correct the communication characteristic (step S3), and the operation of correcting the communication characteristic (step S4) are repeated in this order.

However, in the present embodiment, when it is determined in step S3 that it is necessary to correct the communication characteristic, the R/W device 60 reduces the impedance of the variable output impedance 63, in step S4, by applying the output voltage (Ve) of the correction circuit unit 5 to the variable output impedance 63. At this time, in the present embodiment, the impedance of the variable output impedance 63 is reduced so as to correct the communication state from the communication state of the region C of FIG. 8 to the communication state of the region B of FIG. 8. Therefore, the transmission output (transmission power) of the R/W device 60 is increased, and the detection voltage Vov on the non-contact IC card side is increased.

As described above, even in the present embodiment, as in the first embodiment, the R/W device 60 can determine the communication state and can correct the communication state to the good state based on the determination result. However, in the communication characteristic correcting method of the present embodiment, the improvement effect of, for example, the phase characteristic at the time of transmission and reception, the impedance matching, or the like, is smaller than the methods (resonance characteristic correcting methods) of the first to third embodiments, and hence, the improvement effect in the data communication characteristic of modulation and demodulation signals is also small.

[Sixth Embodiment]

As described in the verification experiment 5 (FIG. 10), when the Q factor of the transmission antenna (resonant circuit) of the R/W device is increased, the monitor current Im (coil current) is increased. In the sixth embodiment, the method (method (c)) for increasing the coil current by increasing the Q factor (communication characteristic) of the transmission antenna, and increasing the transmission output of the R/W device accordingly will be described below. Also, in the present embodiment, as in the first embodiment, an example of determining whether the communication state is the state of the region B or the region C in FIG. 8 and correcting the communication state by changing the output characteristic of the R/W device, based on the determination result, will be described below.

(1) Configuration of R/W Device

Figure 17:
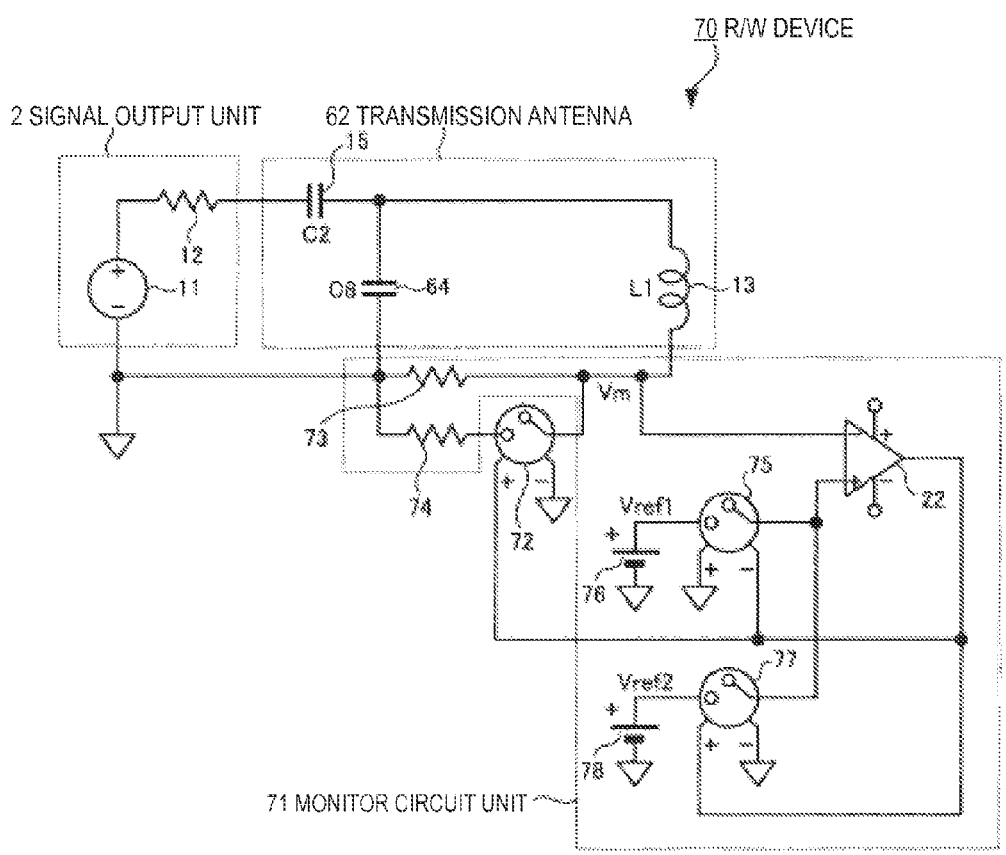
FIG. 17 is a circuit configuration diagram of an R/W device according to a sixth embodiment.

FIG. 17 illustrates a circuit configuration of an R/W device according to a sixth embodiment. Also, in the R/W device 70 of the present embodiment, which is illustrated in FIG. 17, the same elements as those of the R/W device 1 of the first embodiment, which is illustrated in FIG. 11, are assigned with the same reference numerals.

The R/W device 70 (transmission device) includes a signal output unit 2, a transmission antenna 62 (transmission unit), a monitor circuit unit 71 (communication correction unit), and a changeover switch 72 (communication correction unit). Also, the monitor circuit unit 71 and the changeover switch 72 are mounted on a single LSI (integrated circuit) in an actual circuit. Also, the signal output unit 2 of the present embodiment is the same configuration as that of the first embodiment, and the transmission antenna 62 of the present embodiment is the same configuration as that of the sixth embodiment. Thus, a description about the configuration of the signal output unit 2 and the transmission antenna 62 will be omitted herein.

The monitor circuit unit 71 is a circuit that monitors a coil current flowing through an antenna coil 13. The monitor circuit unit 71 includes a first monitor resistor 73, a second monitor resistor 74, a comparator 22, a first power switch 75, a first reference power supply 76, a second power switch 77, and a second reference power supply 78. Also, the comparator 22 of the present embodiment is the same configuration as that of the first embodiment. Also, in the present embodiment, due to the monitor resistor, the coil current flowing through the antenna coil 13 is converted into a voltage (monitor voltage Vm), and the communication state is determined based on the converted monitor voltage Vm.

Also, a terminal of one side of the first monitor resistor 73 is connected to a terminal of one side of the antenna coil 13, and a terminal of the other side of the first monitor resistor 73 is connected to a terminal of one side of a parallel capacitor 64 and a ground. Also, in the present embodiment, the first monitor resistor 73 is the same configuration as the monitor resistor 21 of the first embodiment, and is configured by, for example, a resistive element having a resistance of 1 Ω.

A terminal of one side of the second monitor resistor 74 is connected to a terminal of one side of the antenna coil 13 through the changeover switch 72, and a terminal of the other side of the second monitor resistor 74 is connected to the terminal of one side of the parallel capacitor 64 and the ground. That is, the series circuit configured by the second monitor resistor 74 and the changeover switch 72 is connected in parallel to the first monitor resistor 73. Also, in the present embodiment, the second monitor resistor 74 is configured by a resistive element whose resistance is the same as the resistance of the first monitor resistor 73, for example, a resistive element having a resistance of 1 Ω.

An input terminal of the first power switch 75 is connected to an output terminal of the first reference power supply 76, and an output terminal of the first power switch 75 is connected to an input terminal of "+" side of the comparator 22. Also, a control terminal of "+" side of the first power switch 75 is grounded, and a control terminal of "−" side is connected to an output terminal of the comparator 22. Also, the ON/OFF of the first power switch 75 is controlled by the output signal of the comparator 22 of the monitor circuit unit 71.

The first reference power supply 76 outputs the optimum value of the monitor voltage Vm (half the maximum value: the first reference voltage Vref1) at a Q factor of a case where it is unnecessary to correct the communication characteristic (a case where it is unnecessary to increase the Q factor of the transmission antenna 62). For example, in the R/W device having the correlation characteristic between the detection output Vov and the monitor voltage Vm as illustrated in FIG. 8, the first reference power supply 76 can be configured in the same manner as the reference power supply 23 of the first embodiment, and outputs the first reference voltage Vref1 of 160 mV.

Also, an input terminal of the second power switch 77 is connected to an output terminal of the second reference power supply 78, and an output terminal of the second power switch 77 is connected to an input terminal of "+" side of the comparator 22. Also, a control terminal of "+" side of the second power switch 77 is connected to an output terminal of the comparator 22, and a control terminal of "−" side is grounded. Also, the ON/OFF of the second power switch 77 is controlled by the output signal of the comparator 22 of the monitor circuit unit 71.

The second reference power supply 78 outputs the optimum value of the monitor voltage Vm (half the maximum value: the second reference voltage Vref2) at a Q factor of a case where the communication characteristic is corrected (a case where the Q factor of the transmission antenna 62 is increased). As described in the verification experiment 5 (FIG. 10), when the Q factor of the transmission antenna 62 (resonant circuit) of the R/W device 70 is increased, the maximum value and the optimum value of the monitor voltage Vm (half the maximum value: the monitor voltage Vm when the detection output Vov is maximum) is also changed. Thus, in the present embodiment, at the time of correcting the communication characteristic, the reference voltage (second reference voltage Vref2) to be compared with the monitor voltage Vm is changed with the reference voltage (first reference voltage Vref1) at the time of non-correction.

A control terminal of "+" side of the changeover switch 72 is connected to an output terminal of the comparator 22, and a control terminal of "−" side is grounded. Also, a terminal of one side of the changeover switch 72 is connected to a connection point between the antenna coil 13 and the first monitor resistor 73, and a terminal of the other side of the changeover switch 72 is connected to a terminal of one side of the second monitor resistor 74. Also, the ON/OFF of the changeover switch 72 is controlled by the output signal of the comparator 22 of the monitor circuit unit 71.

In the R/W device 70 of the present embodiment, in a case where the monitor voltage Vm is higher than the first reference voltage Vref (160 mV) (a case where the communication state is the state of the region B in FIG. 8), the changeover switch 72 and the second power switch 77 become an OFF state, and the first power switch 75 becomes an ON state. Thus, in this state, the threshold value used to determine the communication state becomes the reference voltage Vref1.

On the other hand, in a case where the monitor voltage Vm is equal to or lower than the first reference voltage Vref (160 mV) (a case where the communication state is the state of the region C in FIG. 8), the changeover switch 72 and the second power switch 77 become an ON state, and the first power switch 75 becomes an OFF state. In this case, since the resistance of the monitor resistor is half the resistance prior to the switch changeover, the Q factor is increased and the coil current is also increased. As a result, the transmission output (transmission power) of the R/W device 70 is increased, and the detection voltage Vov on the non-contact IC card side is increased. Also, in this state, the threshold value used to determine the communication state becomes the second reference voltage Vref2.

(2) Operation of R/W Device

Next, the communication state monitoring operation and the communication characteristic correcting operation of the R/W device 70 of the present embodiment will be described below. The communication state monitoring operation and the communication characteristic correcting operation according to the present embodiment are performed by the same procedures as those of the first embodiment (FIG. 12). Specifically, the operation of monitoring the coil current flowing through the transmission antenna 62 (monitor voltage Vm) (step S1), the operation of determining the communication state (step S2), the operation of determining whether to correct the communication characteristic (step S3), and the operation of correcting the communication characteristic (step S4) are repeated in this order.

However, in the present embodiment, when it is determined in step S3 that it is necessary to correct the communication state, the R/W device 70 sets the changeover switch 72 to an ON state in step S4, so that the Q factor of the transmission antenna 62 is increased to increase the coil current. Therefore, the transmission output (transmission power) of the R/W device 70 is increased, and the detection voltage Vov on the non-contact IC card side is increased.

As described above, even in the present embodiment, as in the first embodiment, the R/W device 70 can determine the communication state and can correct the communication state to the good state based on the determination result. However, in the communication characteristic correcting method of the present embodiment, as in the fifth embodiment, the improvement effect of, for example, the phase characteristic at the time of transmission and reception, the impedance matching, or the like, is small, and hence, the improvement effect in the data communication characteristic of modulation and demodulation signals is also small.

[Seventh Embodiment]

In the seventh embodiment, a method for increasing a coil current by increasing a capacitance of a series capacitor of a transmission antenna (by reducing impedance) and thus increasing a transmission output of an R/W device will be described below. Also, in the present embodiment, as in the first embodiment, an example of determining whether the communication state is the state of the region B or the region C in FIG. 8 and correcting the communication state by changing the output characteristic of the R/W device, based on the determination result, will be described below.

(1) Configuration of R/W Device

Figure 18:
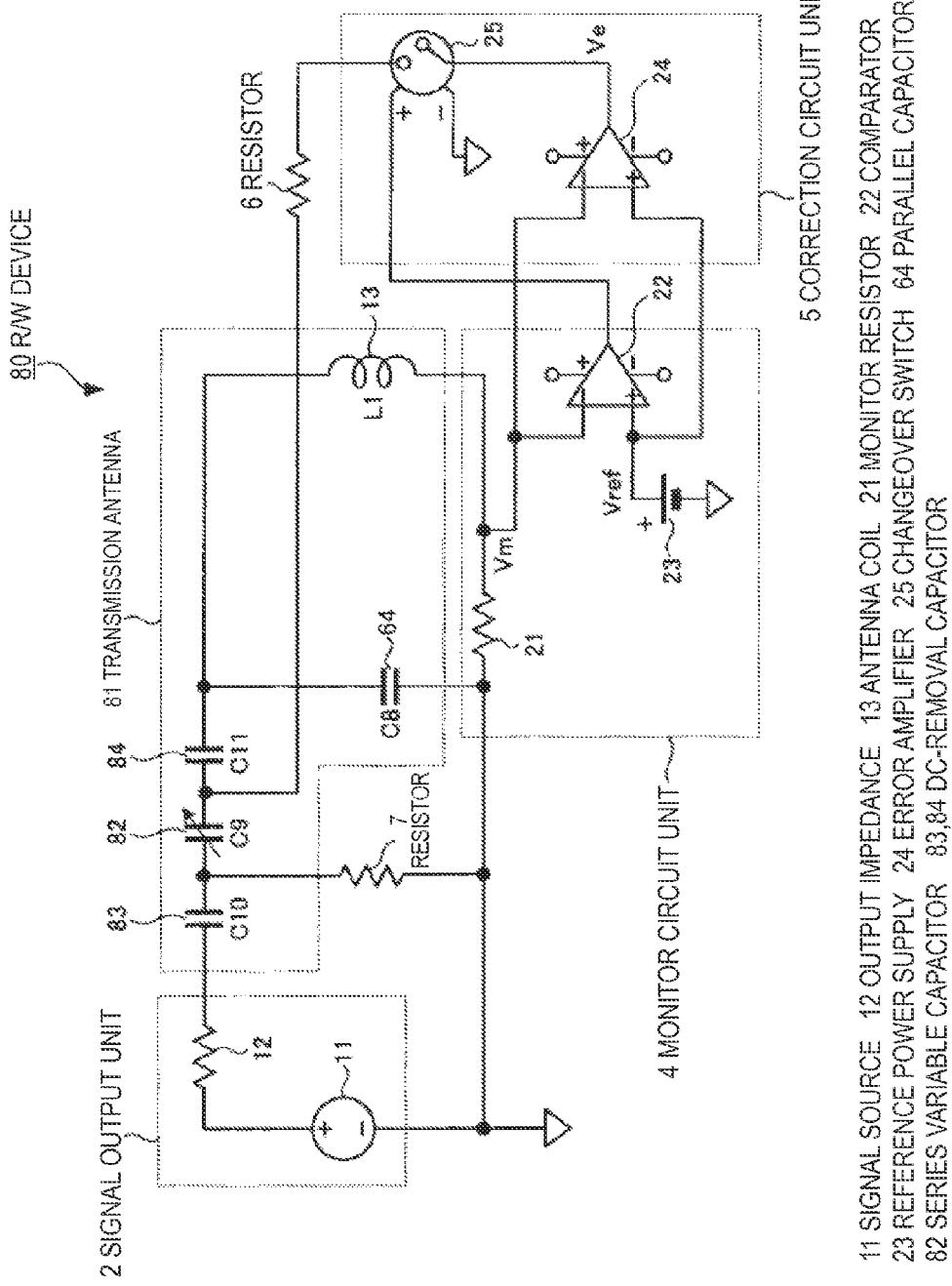
FIG. 18 is a circuit configuration diagram of an R/W device according to a seventh embodiment.

FIG. 18 illustrates a circuit configuration of an R/W device according to a seventh embodiment. Also, in the R/W device 80 of the present embodiment, which is illustrated in FIG. 18, the same elements as those of the R/W device 1 of the first embodiment, which is illustrated in FIG. 11, are assigned with the same reference numerals.

The R/W device 80 (transmission device) includes a signal output unit 2, a transmission antenna 81 (transmission unit), a monitor circuit unit 4 (communication correction unit), a correction circuit unit 5 (communication correction unit), and two resistors 6 and 7. Also, the monitor circuit unit 4 and the correction circuit unit 5 are mounted on a single LSI (integrated circuit) in an actual circuit. Also, in the R/W device 80 of the present embodiment, since the configuration other than the transmission antenna 81 is the same as that of the corresponding parts of the first embodiment, only the configuration of the transmission antenna 81 will be described below.

The transmission antenna 81 is configured by an antenna coil 13, a parallel capacitor 64, a series variable capacitor 82, and two DC-removal capacitors 83 and 84. Also, the antenna coil 13 and the parallel capacitor 64 of the present embodiment are the same configuration as the corresponding circuit elements of the sixth embodiment (FIG. 17). That is, in the present embodiment, the antenna size of the transmission antenna 81 (antenna coil 13) is the small size (see FIG. 2).

In the present embodiment, the DC-removal capacitor 83, the series variable capacitor 82, and the DC-removal capacitor 84 are serially connected in this order. A terminal of one side of the series circuit of the three capacitors (on the DC-removal capacitor 83 side) is connected to a terminal of one side of output impedance 12. Also, a terminal of the other side of the series circuit of the three capacitors (on the DC-removal capacitor 84 side) is connected to a terminal of one side (opposite side to the monitor resistor 21 side) of the antenna coil 13 and a terminal of one side (opposite side to the ground side) of the parallel capacitor 64.

Furthermore, a terminal of the series variable capacitor 82 on the DC-removal capacitor 84 is connected to an output terminal of the correction circuit unit 5 (changeover switch 25) through the resistor 6, and a terminal of the series variable capacitor 82 on the DC-removal capacitor 83 is grounded through the resistor 7.

The series variable capacitor 82 is configured by a variable capacitive element, whose capacitance is changed by adding a bias voltage (control voltage). For example, the series variable capacitor 82 can be configured by a thin-film capacitor using a ferroelectric, a diode called a varicap, or the like. Also, the two DC-removal capacitors 83 and 84 are capacitors provided so that the control voltage applied to the series variable capacitor 82 cannot be applied to the antenna coil 13. Thus, the capacitances C10 and C11 of the two DC-removal capacitors 83 and 84 are all set to at least ten times the capacitance C9 of the series variable capacitor 82.

In the R/W device 80 of the present embodiment, in a case where the monitor voltage Vm is equal to or lower than the reference voltage Vref (160 mV) (a case where the communication state is the communication state of the region C in FIG. 8), the changeover switch 25 is controlled to an ON state by the output signal of the comparator 22. In this case, the output voltage Ve of the correction circuit unit 5 is applied to the terminal of the series variable capacitor 82 on the DC-removal capacitor 84, and the bias voltage applied between the two terminals of the series variable capacitor 82 is lowered. Therefore, the capacitance C9 of the series variable capacitor 82 is increased (impedance of the series variable capacitor 82 is reduced), and the coil current (transmission current) is increased. As a result, the transmission output (transmission power) of the R/W device 80 is increased, and the detection voltage Vov on the non-contact IC card side is also increased.

On the other hand, in a case where the monitor voltage Vm is higher than the reference voltage Vref (160 mV) (a case where the communication state is the communication state of the region B in FIG. 8), the R/W device 80 performs control such that the changeover switch 25 becomes an OFF state, and does not change the capacitance C9 of the series variable capacitor 82.

(2) Operation of R/W Device

Next, the communication state monitoring operation and the communication characteristic correcting operation of the R/W device 80 of the present embodiment will be described. The communication state monitoring operation and the communication characteristic correcting operation according to the present embodiment are performed by the same procedures as those of the first embodiment (FIG. 12). Specifically, the operation of monitoring the coil current flowing through the transmission antenna 81 (monitor voltage Vm) (step S1), the operation of determining the communication state (step S2), the operation of determining whether to correct the communication characteristic (step S3), and the operation of correcting the communication characteristic (step S4) are repeated in this order.

However, in the present embodiment, when it is determined in step S3 that it is necessary to correct the communication characteristic, the R/W device 80 applies the output voltage (Ve) of the correction circuit unit 5 to the terminal of the series variable capacitor 82 on the DC-removal capacitor 84 in step S4. Therefore, the capacitance C9 of the series variable capacitor 82 is increased. Also, at this time, in the present embodiment, the capacitance C9 of the series variable capacitor 82 is increased so as to correct the communication state from the communication state of the region C of FIG. 8 to the communication state of the region B of FIG. 8. As a result, the transmission output (transmission power) of the R/W device 80 is increased, and the detection voltage Vov on the non-contact IC card side is increased.

As described above, even in the present embodiment, as in the first embodiment, the R/W device 80 can determine the communication state and can correct the communication state to the good state based on the determination result. However, in the communication characteristic correcting method of the present embodiment, as described above, the transmission output (output characteristic) is corrected, but the capacitance of the series capacitor of the transmission antenna 81 is also changed. Thus, the resonance characteristic of the transmission antenna 81 is also corrected.

Also, in the present embodiment, the example of changing the capacitance C9 of the series variable capacitor 82 has been described, but the present disclosure is not limited thereto. It may also be configured such that two series capacitors are prepared in the transmission antenna, and the series capacitor to be used is switched according to the communication state.

<3. Various Modifications and Various Applications>

The transmission device (R/W device), the communication state monitoring method, and the communication characteristic correcting method according to the present disclosure are not limited to the various embodiments described above, and various modifications and applications can be considered.

[Modification 1]

In the first to third embodiments, the example of correcting the communication characteristic by changing the capacitance of the parallel capacitor or the inductance of the antenna coil has been described. Also, in each of the fifth to seventh embodiments, the example of correcting the communication characteristic by changing one parameter of the Q factor of the transmission antenna and the capacitance of the series capacitor has been described. However, the present disclosure is not limited thereto. For example, the communication state may be corrected by appropriately combining the first to third and fifth to seventh embodiments and changing a plurality of parameters.

[Modification 2]

The R/W devices of the first to seventh embodiments may include a display unit that displays the determination result of the communication state. In this case, a current communication state may be displayed on the display unit, without regard to the good communication state and the poor communication state, and the communication state may be displayed on the display unit only when the communication state is poor. Also, in the latter case, for example, it may be configured such that the display unit is configured by a lamp or the like, and, when the communication state is poor, a user is informed of the poor communication state by lighting the lamp or the like.

[Modification 3]

Each of the R/W devices of the first to seventh embodiments may have a function of transmitting data related to the determination result of the communication state to an external device. Also, in this case, a display unit that displays the determination result of the communication state may be further provided in the R/W device, and the data related to the determination result of the communication state may be displayed on the display unit.

[Application 1]

In the various embodiments, examples in which the communication state monitoring method and the communication characteristic correcting method of the present disclosure are applied to the R/W device, that is, the transmission device, have been described, but the present disclosure is not limited thereto. The communication state monitoring method and the communication characteristic correcting method can be applied to, for example, a portable communication device (communication device), such as a mobile communication terminal, which has both the R/W function and the IC card function. In this case, a transmission function unit having the same circuit configuration as the R/W device described in the various embodiments, and a reception function unit having the same circuit configuration as, for example, the non-contact IC card 120 of the evaluation system 100 described in FIG. 1 are provided in a non-contact communication unit of the portable communication device.

[Application 2]

In the various embodiments, the communication state monitoring technology of the non-contact communication system, which transmits and receives information, and the R/W device using the same have been mainly described. However, for example, the same circuit configuration as the non-contact transmission system is also used in a wireless power transmission system (wireless feeding system) that transmits and receives energy and signals by magnetically coupling the transmission antenna and the reception antenna. Thus, the technology of the present disclosure can also be applied to, for example, a wireless power transmission system and a non-contact feeding device (transmission device) used in the corresponding system.

Additionally, the present technology may also be configured as below.

(1)

A transmission device including:

a transmission unit that includes an antenna coil and performs communication with an external device by electromagnetic coupling;

a signal output unit that generates a signal of a predetermined frequency and outputs the generated signal to the transmission unit;

a communication monitor unit that monitors information about a current flowing through the antenna coil and determines a communication state based on the monitored information; and a communication correction unit that corrects a communication characteristic based on a determination result of the communication state in the communication monitor unit.

(2)

The transmission device according to (1), wherein the communication correction unit corrects the communication characteristic by changing at least one of a capacitance, an inductance, and a Q factor of the transmission unit, based on the determination result of the communication state in the communication monitor unit.

(3)

The transmission device according to (2), wherein the transmission unit includes a parallel capacitor that is connected in parallel to the antenna coil and has a variable capacitance, and wherein the communication correction unit changes the capacitance of the parallel capacitor, based on the determination result of the communication state in the communication monitor unit.

(4)

The transmission device according to (2), wherein the transmission unit includes a series capacitor that is connected in series to the antenna coil and has a variable capacitance, and wherein the communication correction unit changes the capacitance of the series capacitor, based on the determination result of the communication state in the communication monitor unit.

(5)

The transmission device according to any one of (1) to (4), wherein the communication correction unit corrects the communication characteristic by increasing the current flowing through the antenna coil, based on the determination result of the communication state in the communication monitor unit.

(6)

The transmission device according to any one of (1) to (5), wherein the communication correction unit corrects the communication characteristic by reducing output impedance of the signal output unit, based on the determination result of the communication state in the communication monitor unit.

(7)

The transmission device according to any one of (1) to (6), wherein the communication correction unit changes a Q factor of the transmission unit from a first Q factor to a second Q factor greater than the first Q factor, based on the determination result of the communication state in the communication monitor unit, and wherein the communication monitor unit has a first determination threshold value of the communication state, which is used when the Q factor of the transmission unit is the first Q factor, and a second determination threshold value of the communication state, which is used when the Q factor of the communication unit is the second value, and switches a threshold value for determining the communication state between the first determination threshold value and the second threshold value, based on the determination result of the communication state.

(8)

The transmission device according to any one of (1) to (7), wherein the information about the current flowing through the antenna coil is a voltage value corresponding to the current flowing through the antenna coil.

(9)
The transmission device according to (8),
wherein the communication monitor unit determines the communication state by comparing half of a maximum value of the voltage value corresponding to the current flowing through the antenna coil with the monitored voltage value.

(10)
The transmission device according to (8),
wherein the communication monitor unit determines the communication state by comparing a predetermined threshold voltage for identifying whether an external reception device exists in a non-contact communicable range with the monitored voltage value.

(11)
The transmission device according to (10),
wherein, when the communication monitor unit determines that the external reception device does not exist in the non-contact communicable range, the communication correction unit corrects a difference between a phase of the signal generated by the signal output unit and a phase of a signal transmitted from the transmission unit.

(12)
The transmission device according to any one of (1) to (11), further including:
a display unit that displays the determination result of the communication state in the communication monitor unit.

(13)
The transmission device according to any one of (1) to (12),
wherein the transmission unit transmits data, which is related to the determination result of the communication state in the communication monitor unit, to an outside.

(14)
A transmission/reception device including:
a transmission function unit including
a transmission unit that includes an antenna coil and performs communication with an outside by electromagnetic coupling,
a signal output unit that generates a signal of a predetermined frequency and outputs the generated signal to the transmission unit,
a communication monitor unit that monitors information about a current flowing through the antenna coil and determines a communication state based on the monitored information, and
a communication correction unit that corrects a communication characteristic based on a determination result of the communication state in the communication monitor unit; and
a reception function unit that includes a reception antenna and performs communication with an outside by electromagnetic coupling.

(15)
An integrated circuit including:
a communication monitor unit that monitors information about a current flowing through an antenna coil of a transmission antenna performing communication with an external device by electromagnetic coupling, and determines a communication state based on the monitored information; and
a communication correction unit that corrects a communication characteristic based on a determination result of the communication state in the communication monitor unit.

(16)
A communication state monitoring method performed by a transmission device, the transmission device including a transmission unit that includes an antenna coil and performs communication with an outside by electromagnetic coupling, and a communication monitor unit that monitors information about a current flowing through the antenna coil, the method including:
monitoring, by the communication monitor unit, information about the current flowing through the antenna coil; and
determining, by the communication monitor unit, a communication state based on the monitored information about the current flowing through the antenna coil.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

Reference Signs List

1 R/W device
2 signal output unit
3 transmission antenna
4 monitor circuit unit
5 correction circuit unit
6, 7 resistor
11 signal source
12 output impedance
13 antenna coil
14 parallel variable capacitor
15 series capacitor
16, 17 DC-removal capacitor
21 monitor resistor
22 comparator
23 reference power supply
24 error amplifier
25 changeover switch

The invention claimed is:
1. A transmission device comprising:
a transmission unit that includes an antenna coil and performs communication with an external device by electromagnetic coupling;
a signal output unit that generates a signal of a predetermined frequency and outputs the generated signal to the transmission unit;
a communication monitor unit that monitors information about a current flowing through the antenna coil and determines a communication state based on the monitored information; and
a communication correction unit that corrects a communication characteristic based on a determination result of the communication state in the communication monitor unit,
wherein the communication correction unit is configured to change a Q factor of the transmission unit from a first Q factor to a second Q factor greater than the first Q factor, based on the determination result of the communication state in the communication monitor unit, and
wherein the communication monitor unit has a first determination threshold value of the communication state, which is used when the Q factor of the transmission unit is the first Q factor, and a second determination threshold value of the communication state, which is used when the Q factor of the communication unit is the second Q factor, and is configured to switch a threshold value for determining the communication state between the first determination threshold value and the second threshold value, based on the determination result of the communication state.

2. The transmission device according to claim 1, wherein the communication correction unit is configured to correct the communication characteristic by changing at least one of a capacitance, an inductance, and a Q factor of the transmission unit, based on the determination result of the communication state in the communication monitor unit.

3. The transmission device according to claim 2, wherein the transmission unit includes a parallel capacitor that is connected in parallel to the antenna coil and has a variable capacitance, and
wherein the communication correction unit is configured to change the capacitance of the parallel capacitor, based on the determination result of the communication state in the communication monitor unit.

4. The transmission device according to claim 2, wherein the transmission unit includes a series capacitor that is connected in series to the antenna coil and has a variable capacitance, and
wherein the communication correction unit is configured to change the capacitance of the series capacitor, based on the determination result of the communication state in the communication monitor unit.

5. The transmission device according to claim 1, wherein the communication correction unit is configured to correct the communication characteristic by increasing the current flowing through the antenna coil, based on the determination result of the communication state in the communication monitor unit.

6. The transmission device according to claim 1, wherein the communication correction unit is configured to correct the communication characteristic by reducing output impedance of the signal output unit, based on the determination result of the communication state in the communication monitor unit.

7. The transmission device according to claim 1, wherein the information about the current flowing through the antenna coil is a voltage value corresponding to the current flowing through the antenna coil.

8. The transmission device according to claim 7, wherein the communication monitor unit is configured to determine the communication state by comparing half of a maximum value of the voltage value corresponding to the current flowing through the antenna coil with the monitored voltage value.

9. The transmission device according to claim 7, wherein the communication monitor unit is configured to determine the communication state by comparing a predetermined threshold voltage for identifying whether an external reception device exists in a non-contact communicable range with the monitored voltage value.

10. The transmission device according to claim 9, wherein, when the communication monitor unit determines that the external reception device does not exist in the non-contact communicable range, the communication correction unit corrects a difference between a phase of the signal generated by the signal output unit and a phase of a signal transmitted from the transmission unit.

11. The transmission device according to claim 1, further comprising:
a display unit that displays the determination result of the communication state in the communication monitor unit.

12. The transmission device according to claim 1, wherein the transmission unit is configured to transmit data, which is related to the determination result of the communication state in the communication monitor unit, to an outside.

13. A transmission/reception device comprising:
a transmission function unit including
a transmission unit that includes an antenna coil and performs communication with an outside by electromagnetic coupling,
a signal output unit that generates a signal of a predetermined frequency and outputs the generated signal to the transmission unit,
a communication monitor unit that monitors information about a current flowing through the antenna coil and determines a communication state based on the monitored information, and
a communication correction unit that corrects a communication characteristic based on a determination result of the communication state in the communication monitor unit; and
a reception function unit that includes a reception antenna and performs communication with an outside by electromagnetic coupling,
wherein the communication correction unit is configured to change a Q factor of the transmission unit from a first Q factor to a second Q factor greater than the first Q factor, based on the determination result of the communication state in the communication monitor unit, and
wherein the communication monitor unit has a first determination threshold value of the communication state which is used when the Q factor of the transmission unit is the first Q factor, and a second determination threshold value of the communication state, which is used when the Q factor of the communication unit is the second Q factor, and is configured to switch a threshold value for determining the communication state between the first determination threshold value and the second threshold value, based on the determination result of the communication state.

14. An integrated circuit comprising:
a communication monitor unit that monitors information about a current flowing through an antenna coil of a transmission antenna performing communication with an external device by electromagnetic coupling, and determines a communication state based on the monitored information; and
a communication correction unit that corrects a communication characteristic based on a determination result of the communication state in the communication monitor unit,
wherein the communication correction unit is configured to change a Q factor of a transmission unit from a first Q factor to a second Q factor greater than the first Q factor, based on the determination result of the communication state in the communication monitor unit, and
wherein the communication monitor unit has a first determination threshold value of the communication state which is used when the Q factor of the transmission unit is the first Q factor, and a second determination threshold value of the communication state, which is used when the Q factor of the communication unit is the second Q factor, and is configured to switch a threshold value for determining the communication state between the first determination threshold value and the second threshold value, based on the determination result of the communication state.

15. A communication state monitoring method performed by a transmission device, the transmission device including a transmission unit that includes an antenna coil and performs communication with an outside by electromagnetic coupling, a communication monitor unit that monitors information about a current flowing through the antenna coil, and a communication correction unit that corrects a communication characteristic based on a determination result of the communication state in the communication monitor unit, the method comprising:

monitoring, by the communication monitor unit, information about the current flowing through the antenna coil; and determining, by the communication monitor unit, a communication state based on the monitored information about the current flowing through the antenna coil changing, by the communication correction unit, a Q factor of a transmission unit from a first Q factor to a second Q factor greater than the first Q factor, based on the determination result of the communication state in the communication monitor unit, and switching, by the communication monitor unit, a threshold value for determining the communication state between a first determination threshold value and a second threshold value, based on the determination result of the communication state, wherein the communication monitor unit includes the first determination threshold value of the communication state, which is used when the Q factor of the transmission unit is the first Q factor, and the second determination threshold value of the communication state, which is used when the Q factor of the communication unit is the second Q factor.

16. A transmission device comprising:

a transmission unit that includes an antenna coil and performs communication with an external device by electromagnetic coupling;

a signal output unit that generates a signal of a predetermined frequency and outputs the generated signal to the transmission unit;

a communication monitor unit that monitors information about a current flowing through the antenna coil and determines a communication state based on the monitored information; and a communication correction unit that corrects a communication characteristic based on a determination result of the communication state in the communication monitor unit, wherein the communication correction unit is configured to correct the communication characteristic by changing at least one of a capacitance, an inductance, and a Q factor of the transmission unit, based on the determination result of the communication state in the communication monitor unit, wherein the transmission unit includes a parallel capacitor that is connected in parallel to the antenna coil and has a variable capacitance, and wherein the communication correction unit is configured to change the capacitance of the parallel capacitor, based on the determination result of the communication state in the communication monitor unit.

17. A transmission device comprising:

a transmission unit that includes an antenna coil and performs communication with an external device by electromagnetic coupling;

a signal output unit that generates a signal of a predetermined frequency and outputs the generated signal to the transmission unit;

a communication monitor unit that monitors information about a current flowing through the antenna coil and determines a communication state based on the monitored information; and a communication correction unit that corrects a communication characteristic based on a determination result of the communication state in the communication monitor unit, wherein the communication correction unit is configured to correct the communication characteristic by changing at least one of a capacitance, an inductance, and a Q factor of the transmission unit, based on the determination result of the communication state in the communication monitor unit, wherein the transmission unit includes a series capacitor that is connected in series to the antenna coil and has a variable capacitance, and wherein the communication correction unit is configured to change the capacitance of the series capacitor, based on the determination result of the communication state in the communication monitor unit.

18. A transmission device comprising:

a transmission unit that includes an antenna coil and performs communication with an external device by electromagnetic coupling;

a signal output unit that generates a signal of a predetermined frequency and outputs the generated signal to the transmission unit;

a communication monitor unit that monitors information about a current flowing through the antenna coil and determines a communication state based on the monitored information; and a communication correction unit that corrects a communication characteristic based on a determination result of the communication state in the communication monitor unit, wherein the information about the current flowing through the antenna coil is a voltage value corresponding to the current flowing through the antenna coil, wherein the communication monitor unit is configured to determine the communication state by comparing half of a maximum value of the voltage value corresponding to the current flowing through the antenna coil with the monitored voltage value.

19. An integrated circuit comprising:

a communication monitor unit that monitors information about a current flowing through an antenna coil of a transmission antenna performing communication with an external device by electromagnetic coupling, and determines a communication state based on the monitored information; and a communication correction unit that corrects a communication characteristic based on a determination result of the communication state in the communication monitor unit, wherein the information about the current flowing through the antenna coil is a voltage value corresponding to the current flowing through the antenna coil, wherein the communication monitor unit is configured to determine the communication state by comparing half of a maximum value of the voltage value corresponding to the current flowing through the antenna coil with the monitored voltage value.

* * * * *